(12) United States Patent
Aoyama et al.

(10) Patent No.: US 10,121,683 B2
(45) Date of Patent: **\*Nov. 6, 2018**

(54) LIGHT-IRRADIATION HEAT TREATMENT METHOD AND HEAT TREATMENT APPARATUS

(71) Applicant: SCREEN Holdings Co., Ltd., Kyoto (JP)

(72) Inventors: Takayuki Aoyama, Kyoto (JP); Hikaru Kawarazaki, Kyoto (JP); Masashi Furukawa, Kyoto (JP); Shinichi Kato, Kyoto (JP); Kazuhiko Fuse, Kyoto (JP); Hideaki Tanimura, Kyoto (JP)

(73) Assignee: SCREEN Holdings Co., Ltd., Kyoto (JP)

(\*) Notice: Subject to any disclaimer, the term of this patent is extended or adjusted under 35 U.S.C. 154(b) by 0 days.

This patent is subject to a terminal disclaimer.

(21) Appl. No.: 15/245,662

(22) Filed: Aug. 24, 2016

(65) Prior Publication Data

US 2017/0062249 A1    Mar. 2, 2017

(30) Foreign Application Priority Data

Aug. 26, 2015  (JP) .................... 2015-166511
May 24, 2016  (JP) .................... 2016-103275

(51) Int. Cl.
*H01L 21/26* (2006.01)
*H01L 21/324* (2006.01)
(Continued)

(52) U.S. Cl.
CPC .. *H01L 21/67115* (2013.01); *H01L 21/02356* (2013.01); *H01L 21/2636* (2013.01);
(Continued)

(58) Field of Classification Search
CPC ............. H01L 21/67115; H01L 21/324; H01L 21/67109; H01L 21/28176; H01L 21/2636; H01L 21/28185; H01L 21/02356
See application file for complete search history.

(56) References Cited

U.S. PATENT DOCUMENTS 6,884,719 B2    4/2005  Chang et al.
7,327,947 B2    2/2008  Kusuda ................... 392/416
(Continued)

FOREIGN PATENT DOCUMENTS

CN    1498285    5/2004
JP    3798674    7/2006
(Continued)

OTHER PUBLICATIONS

Taiwanese Office Action dated Apr. 19, 2017 with Japanese translation; portions relevant to prior-art based rejections have been translated into English based on the Japanese translation of same.
(Continued)

*Primary Examiner* — Savitr Mulpuri
(74) *Attorney, Agent, or Firm* — Ostronlenk Faber LLP

(57) ABSTRACT

Over a front surface of a silicon semiconductor wafer is deposited a high dielectric constant film with a silicon oxide film, serving as an interface layer, provided between the semiconductor wafer and the high dielectric constant film. After a chamber houses the semiconductor wafer, a chamber's pressure is reduced to be lower than atmospheric pressure. Subsequently, a gaseous mixture of ammonia and nitrogen gas is supplied into the chamber to return the pressure to ordinary pressure, and the front surface is irradiated with a flash light, thereby performing post deposition annealing (PDA) on the high dielectric constant film. Since the pressure is reduced once to be lower than atmospheric pressure and then returned to ordinary pressure, a chamber's oxygen concentration is lowered remarkably dur-
(Continued)

ing the PDA. This restricts an increase in thickness of the silicon oxide film underlying the high dielectric constant film by oxygen taken in during the PDA.

10 Claims, 12 Drawing Sheets

(51) Int. Cl.
  *H01L 21/67* (2006.01)
  *H01L 21/28* (2006.01)
  *H01L 21/263* (2006.01)
  *H01L 21/02* (2006.01)

(52) U.S. Cl.
  CPC .. *H01L 21/28176* (2013.01); *H01L 21/28185* (2013.01); *H01L 21/324* (2013.01); *H01L 21/67109* (2013.01); *H01L 21/67248* (2013.01)

(56) References Cited

U.S. PATENT DOCUMENTS

| | | | |
|---|---|---|---|
| 8,158,535 B2 | 4/2012 | Honda et al. | |
| 8,247,331 B2 | 8/2012 | Honda et al. | |
| 8,852,966 B2 | 10/2014 | Kiyama et al. | 438/14 |
| 8,963,050 B2* | 2/2015 | Kato | F27B 17/0025 219/383 |
| 9,023,740 B2* | 5/2015 | Kato | H01L 21/26 392/411 |
| 2003/0031793 A1 | 2/2003 | Chang et al. | |
| 2003/0081945 A1 | 5/2003 | Kusuda | 392/416 |
| 2006/0110531 A1 | 5/2006 | Chang et al. | |
| 2010/0323529 A1 | 12/2010 | Honda et al. | |
| 2010/0323531 A1 | 12/2010 | Honda et al. | |
| 2013/0078786 A1 | 3/2013 | Fuse et al. | 438/478 |
| 2013/0203269 A1 | 8/2013 | Yokouchi | 438/795 |
| 2013/0206747 A1 | 8/2013 | Nishide | 219/538 |
| 2013/0337661 A1 | 12/2013 | Kato | |
| 2015/0221533 A1 | 8/2015 | Kato | |
| 2017/0062223 A1* | 3/2017 | Aoyama | H01L 21/28518 |

FOREIGN PATENT DOCUMENTS

| | | |
|---|---|---|
| JP | 2012-064948 | 3/2012 |
| JP | 2012-104808 | 5/2012 |
| JP | 2013-073946 | 4/2013 |
| JP | 2013-084902 | 5/2013 |
| JP | 2013-161936 | 8/2013 |
| JP | 2013-168462 | 8/2013 |
| JP | 2013-207152 | 10/2013 |
| TW | 200836262 | 9/2008 |
| TW | 200847281 | 12/2008 |
| TW | 201314771 | 4/2013 |
| TW | 201405666 | 2/2014 |

OTHER PUBLICATIONS

Taiwanese Office Action for Taiwanese App. No. 105125204 issued Aug. 24, 2017 with English translations of portions relevant to prior-art based rejections based on Japanese translation of same.

* cited by examiner

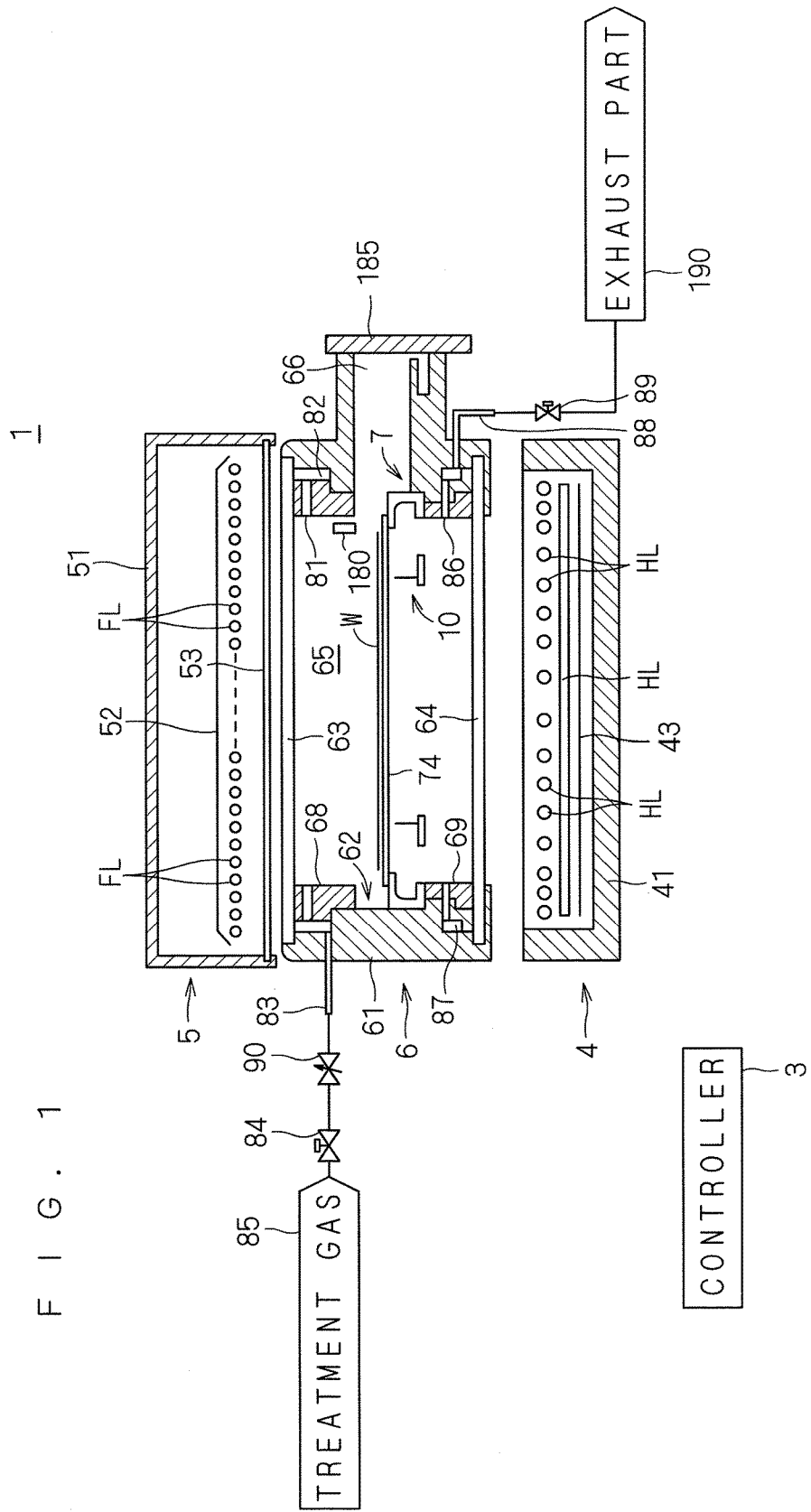
F I G . 1

F I G. 2
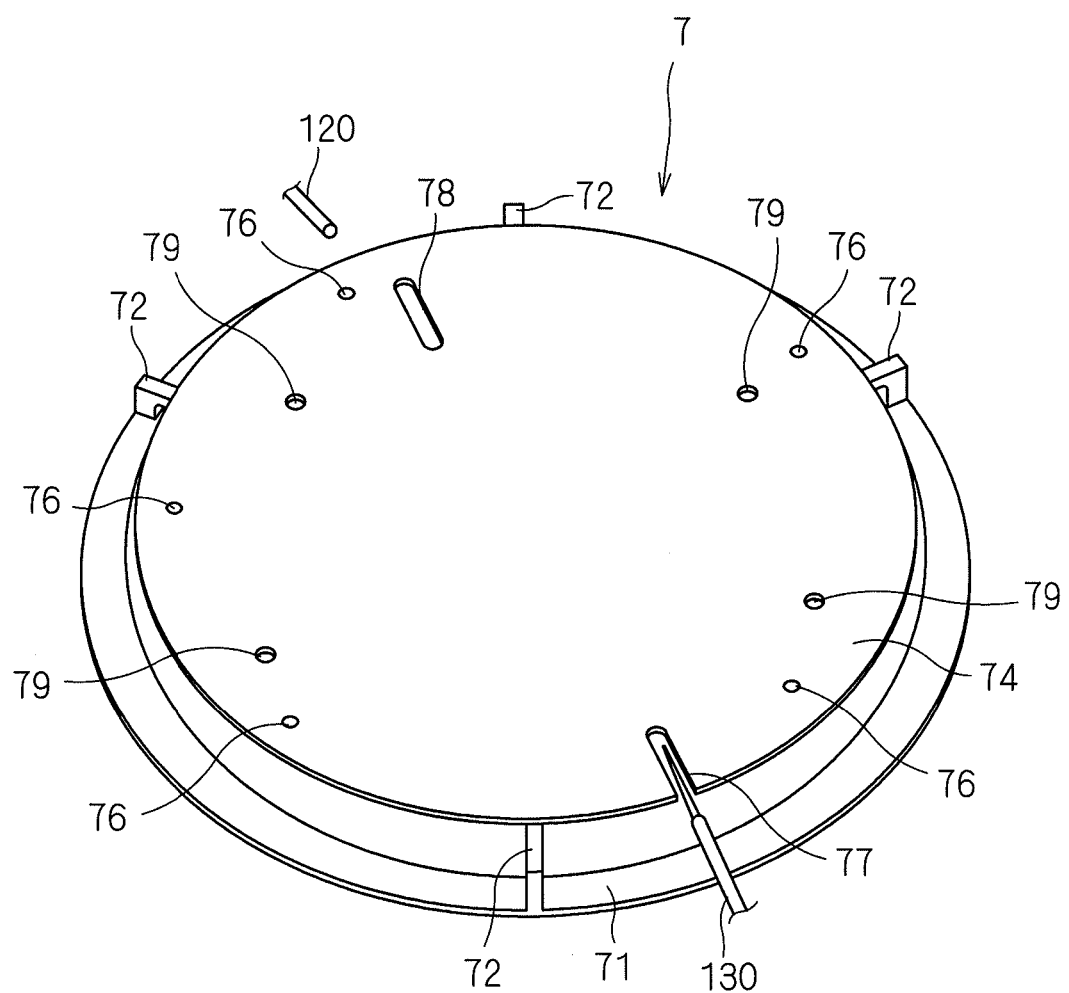

F I G. 4
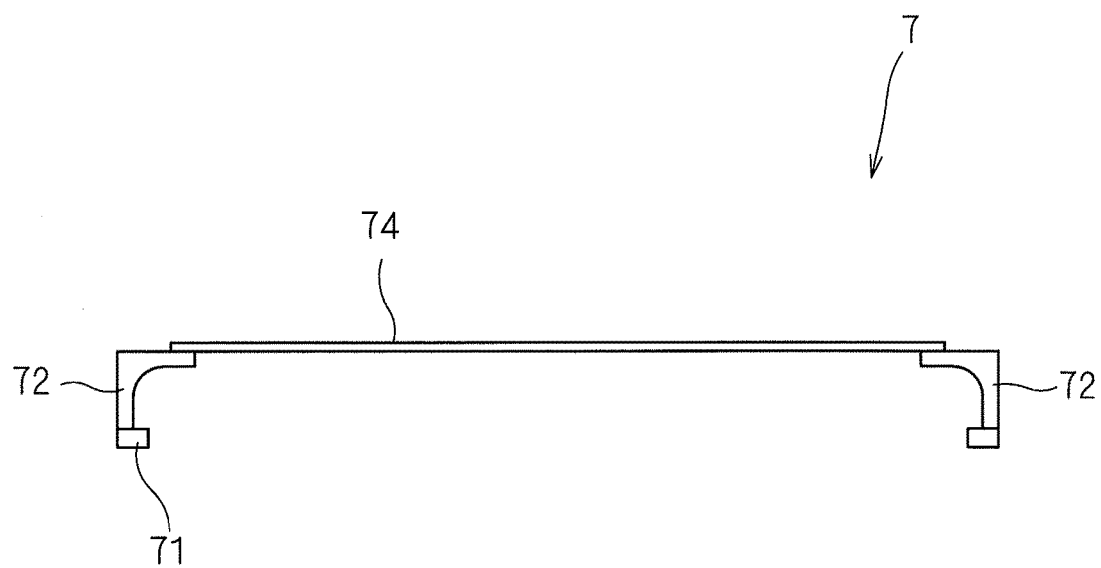

F I G . 8
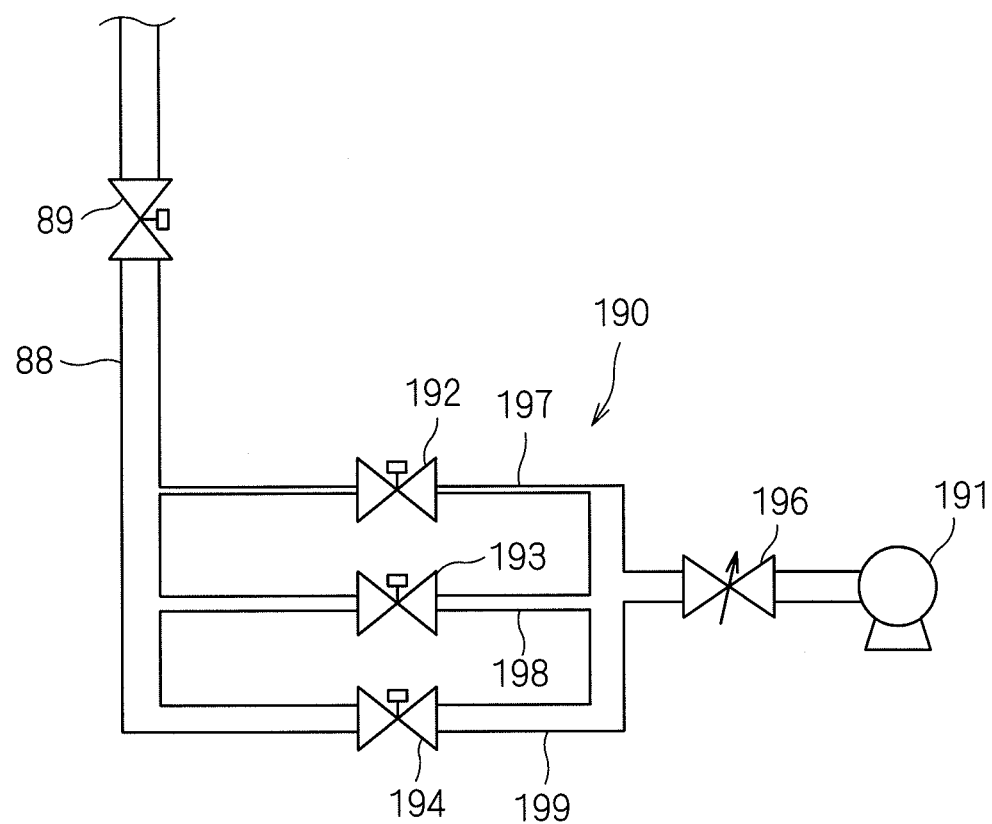

LIGHT-IRRADIATION HEAT TREATMENT METHOD AND HEAT TREATMENT APPARATUS

BACKGROUND OF THE INVENTION

Field of the Invention

The present invention relates to a heat treatment method and a heat treatment apparatus for irradiating a thin-plate-shaped precision electronic substrate (hereinafter referred to simply as a "substrate"), such as a semiconductor wafer including a high dielectric constant film or including a metal gate formed on a high dielectric constant film, with a flash of light to heat the substrate.

Description of the Background Art

In the process of manufacturing a semiconductor device, attention has been paid to flash lamp annealing (FLA) that heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of the light emitted from the xenon flash lamps is shorter than that of the light emitted from conventional halogen lamps, and substantially coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, for example, typically for the activation of impurities implanted in a semiconductor wafer. The irradiation of a surface of a semiconductor wafer implanted with impurities by an ion implantation process with a flash of light from flash lamps allows a temperature rise to an activation temperature only in the surface of the semiconductor wafer in an extremely short time, thereby enabling only the activation of impurities without deep diffusion of the impurities.

It is considered that a high dielectric gate film (high-k film) including a material (high dielectric constant material) having a dielectric constant higher than that of silicon dioxide ($SiO_2$) is used as a gate insulating film of a field-effect transistor (FET) under development. The high dielectric constant film is under development as a new stack structure together with a metal gate including a gate electrode of metal to solve a problem of an increased leakage current associated with a thinner gate insulating film. It is also considered that flash lamp annealing is applied to the heat treatment of a semiconductor wafer having a new stack structure including such a high dielectric constant film.

The high dielectric constant film is formed by depositing a high dielectric constant material on a silicon base material by a technique such as metal organic chemical vapor deposition (MOCVD). Although the high dielectric constant film has a dielectric constant higher than that of a conventional silicon oxide film, the high dielectric constant film immediately after deposition has low crystallinity and involves many defects such as point defects. The deposited high dielectric constant film thus needs to be annealed at high temperature. For example, US 2013/0078786 proposes that the surface of a semiconductor wafer including a high dielectric constant film formed thereover be irradiated with a flash of light for a heat treatment in a short time.

Unfortunately, it has turned out that a high dielectric constant cannot be obtained due to an increased thickness of the silicon oxide film underlying the high dielectric constant film by merely irradiating a semiconductor wafer including the high dielectric constant film formed thereover with a flash of light as disclosed in US 2013/0078786. An increase in thickness of a silicon oxide film results from a heat treatment performed in the presence of oxygen. Examples of the oxygen that causes an increase in film thickness include residual oxygen in a chamber, oxygen adsorbed on the surface of the semiconductor wafer (typically adsorbed in the form of water), and oxygen present as a solid solution in a high dielectric constant film itself. In particular, the oxygen remaining in the chamber during the flash heating treatment is largely responsible for the increase in thickness of a silicon oxide film. In general, semiconductor wafers are transported into and out of a chamber at ordinary pressure in a flash lamp annealer, and accordingly, oxygen in the atmosphere flowing into the chamber during the transport remains in the chamber to increase the concentration of oxygen.

When a flash heating treatment is performed on a semiconductor wafer including a metal gate deposited on a high dielectric constant film, oxygen may diffuse through the metal gate and the high dielectric constant film to increase the thickness of the silicon oxide film underlying the high dielectric constant film and to oxide the metal gate itself.

SUMMARY OF THE INVENTION

The present invention is directed to a method of irradiating a substrate including a high dielectric constant film deposited thereover with a flash of light to heat the substrate.

According to one aspect of the present invention, the method includes (a) transporting a substrate including a high dielectric constant film deposited thereover into a chamber, (b) reducing a pressure in the chamber to a first pressure lower than atmospheric pressure, (c) returning the pressure in the chamber from the first pressure to a second pressure higher than the first pressure, and (d) irradiating a front surface of the substrate with a flash of light from a flash lamp while maintaining the pressure in the chamber at the second pressure.

The concentration of oxygen in the chamber during the irradiation with a flash of light can be reduced, thus restricting an increase in thickness of a silicon oxide film underlying the high dielectric constant film.

Preferably, the first pressure is not greater than one-hundredth of the second pressure.

The influence of remaining air on a reactive gas is reduced.

Preferably, the method further includes (e) before the step (d), raising a temperature of the substrate to a predetermined preheating temperature. In the step (e), a supply of the reactive gas into the chamber is performed in the step (e), and the supply of the reactive gas into the chamber is stopped after the step (d).

The high dielectric constant film is nitrided to some extent, and hydrogen that has entered the high dielectric constant film is desorbed.

Preferably, the second pressure is higher than the first pressure and lower than atmospheric pressure.

The mean free path in irradiation with a flash of light is increased, resulting in a uniform reaction of the high dielectric constant film to the heat treatment. Also, a less time is required for the pressure return, thus improving a throughput.

Preferably, the second pressure is higher than atmospheric pressure.

The reaction of the high dielectric constant film to the heat treatment proceeds even when the treatment temperature during the irradiation with a flash of light is reduced.

Preferably, an exhaust flow rate from the chamber is increased with time in the step (b).

Particles caused by the exhaustion of the gas from the chamber are prevented from swirling up.

Preferably, a supply flow rate into the chamber is increased with time in the step (c).

Particles caused by the supply of the gas into the chamber are prevented from swirling up.

Preferably, after the step (d), when a gas in the chamber is discharged and then an inert gas is supplied into the chamber so that the pressure in the chamber returns to atmospheric pressure, the inert gas is caused to flow at a flow rate ranging from 50 to 100 liters per minute in the chamber.

Particles caused during the irradiation with a flash of light are swept away out of the chamber.

The present invention is also directed to a heat treatment apparatus for irradiating a substrate including a high dielectric constant film deposited thereover with a flash of light to heat the substrate.

According to one aspect of the present invention, a heat treatment apparatus includes a chamber that houses the substrate, a flash lamp that irradiates the substrate housed in the chamber with a flash of light, an exhaust part that exhausts an atmosphere in the chamber, a gas supply part that supplies a predetermined treatment gas to the chamber, and a controller that controls the exhaust part and the gas supply part so that a front surface of the substrate is irradiated with a flash of light from the flash lamp while a pressure in the chamber is reduced to a first pressure lower than atmospheric pressure and then returned to a second pressure higher than the first pressure.

The concentration of oxygen in the chamber is reduced during the irradiation with a flash of light, thus restricting an increase in thickness of a silicon oxide film underlying the high dielectric constant film.

Preferably, the first pressure is not greater than one-hundredth of the second pressure.

The influence of remaining air on a reactive gas is reduced.

Preferably, the heat treatment apparatus further includes a preheating part that raises a temperature of the substrate to a predetermined preheating temperature before the substrate is irradiated with the flash of light. The controller controls the exhaust part and the gas supply part so that the reactive gas is supplied into the chamber when the preheating part preheats the substrate and that the supply of the reactive gas into the chamber is stopped after the substrate is irradiated with the flash of light.

The high dielectric constant film is nitrided to some extent, and hydrogen that has entered the high dielectric constant film is desorbed.

Preferably, the second pressure is higher than the first pressure and lower than atmospheric pressure.

The mean free path in irradiation with a flash of light is increased, resulting in a uniform reaction of the high dielectric constant film to the heat treatment. Also, a less time is required for the pressure return, thus improving a throughput.

Preferably, the second pressure is higher than atmospheric pressure.

The reaction of the high dielectric constant film to the heat treatment proceeds even when the treatment temperature during the irradiation with a flash of light is reduced.

Preferably, the controller controls the gas exhaust part so that an exhaust flow rate from the chamber increases with time when the pressure in the chamber is reduced to the first pressure.

Particles caused by the exhaustion of the gas from the chamber are prevented from swirling up.

Preferably, the controller controls the gas supply part so that a supply flow rate to the chamber increases with time when the pressure in the chamber is returned from the first pressure to the second pressure.

Particles caused by the supply of the gas into the chamber are prevented from swirling up.

Preferably, the controller controls the exhaust part and the gas supply part so that, after the irradiation with the flash of light, when a gas in the chamber is discharged and then an inert gas is supplied into the chamber to return the pressure in the chamber to atmospheric pressure, the inert gas is caused to flow in the chamber at a flow rate ranging from 50 to 100 liters per minute.

Particles caused during the irradiation with a flash of light are swept away out of the chamber.

The present invention therefore has an object to restrict an increase in thickness of a silicon oxide film underlying a high dielectric constant film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal cross-sectional view of a configuration of a heat treatment apparatus according to the present invention;

FIG. 2 is a perspective view of the entire external appearance of a holder;

FIG. 4 is a side view of the holder as seen from one side;

FIG. 8 is a view of a configuration of an exhaust part;

DESCRIPTION OF THE PREFERRED EMBODIMENTS

Figure 3:
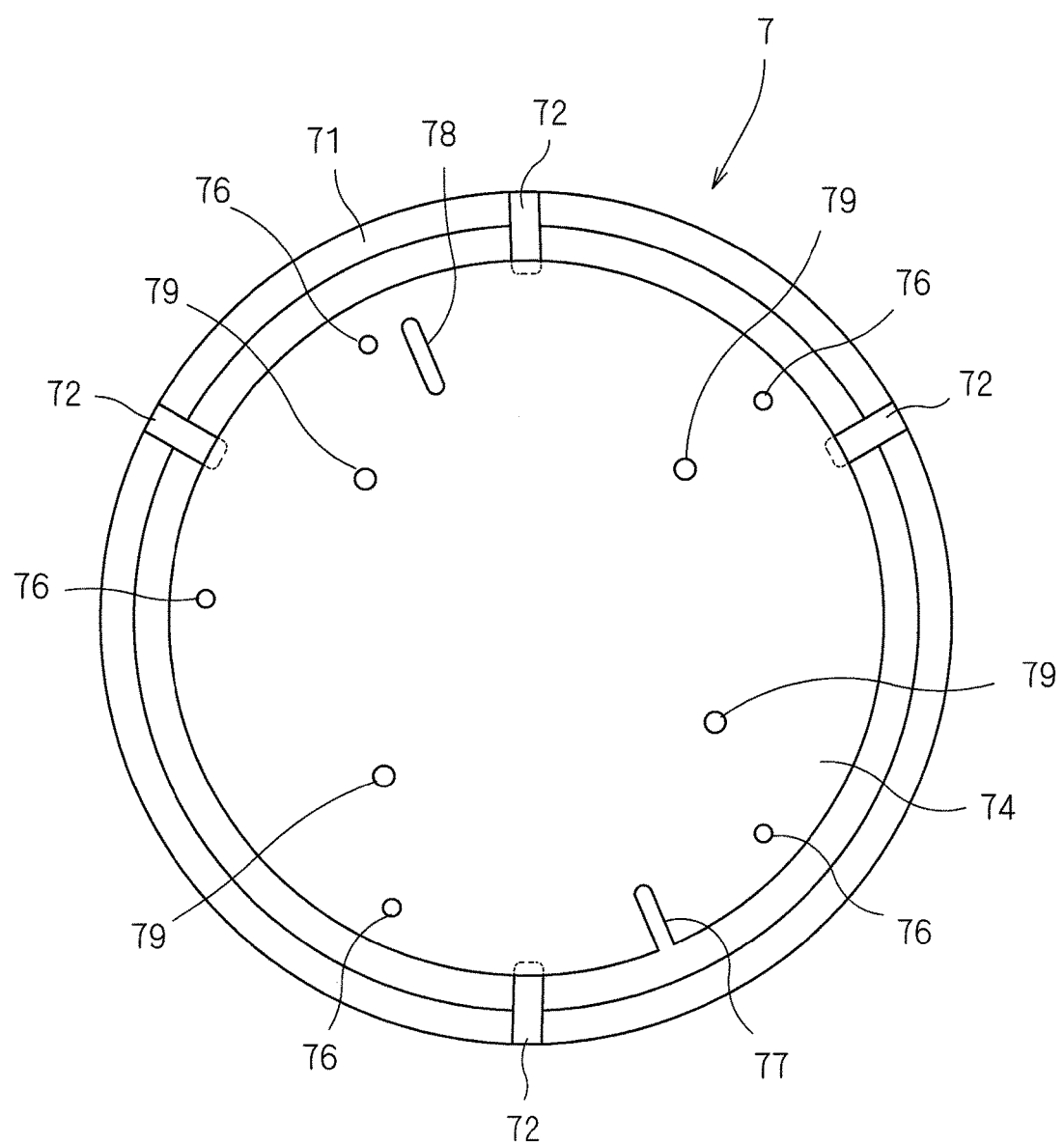
FIG. 3 is a plan view of the holder as seen from above.

Preferred embodiments of the present invention will now be described in detail with reference to the drawings.

First Preferred Embodiment

FIG. 1 is a longitudinal cross-sectional view of a configuration of a heat treatment apparatus 1 according to the present invention. The heat treatment apparatus 1 according to the present preferred embodiment is a flash lamp annealer for irradiating a disk-shaped semiconductor wafer W serving as a substrate with a flash of light to heat the semiconductor wafer W. The diameter size of the semiconductor wafer W to be treated is not particularly limited, which is, for example, 300 or 450 mm. The wafer W before being transported into the heat treatment apparatus 1 has a high dielectric constant film deposited thereover, and the heat treatment apparatus 1 performs post deposition annealing (PDA) on the high dielectric constant film through a heating treatment. For easy understanding, the dimensions and the numbers of respective constituent elements may be exaggerated or simplified as necessary in FIG. 1 and subsequent drawings.

The heat treatment apparatus 1 includes a chamber 6 that houses the semiconductor wafer W, a flash heating part 5 with a plurality of built-in flash lamps FL, and a halogen heating part 4 with a plurality of built-in halogen lamps HL. The flash heating part 5 is located above the chamber 6, and the halogen heating part 4 is located below the chamber 6. The heat treatment apparatus 1 further includes, within the chamber 6, a holding part 7 that holds the semiconductor wafer W in a horizontal position and a transfer mechanism 10 that transfers the semiconductor wafer W between the holding part 7 and the outside of the heat treatment apparatus 1. The heat treatment apparatus 1 further includes a controller 3 that controls operating mechanisms located in the halogen heating part 4, the flash heating part 5, and the chamber 6 for heat treatment of the semiconductor wafer W.

The chamber 6 is configured such that chamber windows made of quartz are mounted to the top and bottom of a tubular chamber side portion 61. The chamber side portion 61 has a substantially tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz and serves as a quartz window that transmits a flash of light emitted from the flash heating part 5 therethrough into the chamber 6. The lower chamber window 64 forming the floor of the chamber 6 is also a disk-shaped member made of quartz and serves as a quartz window that transmits light emitted from the halogen heating part 4 therethrough into the chamber 6. The upper chamber window 63 and the lower chamber window 64 have a thickness of, for example, approximately 28 mm.

A reflection ring 68 is mounted to an upper portion of the inner wall surface of the chamber side portion 61, and a reflection ring 69 is mounted to a lower portion thereof. The reflection rings 68 and 69 are each in the form of an annular ring. The reflection ring 68 on the top is mounted by being inserted downwardly from the top of the chamber side portion 61. The reflection ring 69 on the bottom, on the other hand, is mounted by being inserted upwardly from the bottom of the chamber side portion 61 and fastened with screws (not shown). In other words, the reflection rings 68 and 69 are each removably mounted to the chamber side portion 61. An interior space of the chamber 6, or, a space surrounded by the upper chamber window 63, the lower chamber window 64, the chamber side portion 61, and the reflection rings 68 and 69, is defined as a heat treatment space 65.

A recessed portion 62 is defined in the inner wall surface of the chamber 6 by mounting the reflection rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the reflection ring 68, and an upper end surface of the reflection ring 69. The recessed portion 62 is horizontally formed in an annular shape in the inner wall surface of the chamber 6 and surrounds the holding part 7 that holds the semiconductor wafer W.

The chamber side portion 61 and the reflection rings 68 and 69 are made of metal material (e.g., stainless steel) with high strength and high heat resistance. The inner peripheral surfaces of the reflection rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The upper portion of the inner wall of the chamber 6 has a gas supply port 81 through which a treatment gas (in the present preferred embodiment, nitrogen gas ($N_2$) and ammonia ($NH_3$)) is supplied into the heat treatment space 65. The gas supply port 81 is located at a position above the recessed portion 62 and may be located in the reflection ring 68. The gas supply port 81 is communicatively connected to a gas supply pipe 83 via a buffer space 82 that is formed in an annular shape inside the side wall of the chamber 6. The gas supply pipe 83 is connected to a gas supply source 85. The gas supply source 85 supplies the gas supply pipe 83 with a nitrogen gas or a gaseous mixture of ammonia and nitrogen gas as a treatment gas under the control of the controller 3. Also, a valve 84 and a flow regulating valve 90 are interposed in the path of the gas supply pipe 83. When the valve 84 is opened, a treatment gas is supplied from the gas supply source 85 into the buffer space 82. The flow rate of the treatment gas flowing through the gas supply pipe 83 to the buffer space 82 is regulated by the flow regulating valve 90. The flow rate of the treatment gas determined by the flow regulating valve 90 is variable through the control of the controller 3. The treatment gas flowing in the buffer space 82 flows in a spreading manner within the buffer space 82 that is lower in fluid resistance than the gas supply opening 81, and is supplied through the gas supply opening 81 into the heat treatment space 65. It should be noted that the treatment gas is not limited to nitrogen gas and ammonia, but may be inert gases such as argon (Ar) and helium (He), and reactive gases such oxygen ($O_2$), hydrogen ($H_2$), chlorine ($Cl_2$), hydrogen chloride (HCl), ozone ($O_3$), carbon monoxide (NO), nitrous oxide ($N_2O$), and nitrogen dioxide ($NO_2$).

The lower portion of the inner wall of the chamber 6 has a gas exhaust port 86 through which the gas in the heat treatment space 65 is exhausted. The gas exhaust port 86 is located at a position below the recessed portion 62 and may be located in the reflection ring 69. The gas exhaust port 86 is communicatively connected to a gas exhaust pipe 88 via a buffer space 87 that is formed in an annular shape inside the side wall of the chamber 6. The gas exhaust pipe 88 is connected to an exhaust part 190. Also, a valve 89 is interposed in the path of the gas exhaust pipe 88. When the valve 89 is opened, the gas in the heat treatment space 65 is exhausted from the gas exhaust port 86 through the buffer space 87 into the gas exhaust pipe 88. Alternatively, a plurality of gas supply ports 81 and a plurality of gas exhaust ports 86 may be provided along the circumference of the chamber 6, or the gas supply port 81 and the gas exhaust port 86 may be slit-shaped.

FIG. 8 is a view of a configuration of the exhaust part 190. The exhaust part 190 includes an exhaust pump 191, a flow regulating valve 196, three bypass lines 197, 198, and 199, and three exhaust valves 192, 193, and 194. The gas exhaust pipe 88 guiding the gas exhausted from the chamber 6 is connected through the three bypass lines 197, 198, and 199 to the exhaust pump 191. The three bypass lines 197, 198, and 199 are provided in parallel with each other. The three bypass lines 197, 198, and 199 are different in pipe diameter from each other. The bypass line 197 has the smallest diameter, and the bypass line 199 has the largest diameter. The bypass line 198 has a diameter intermediate between the diameters of the bypass lines 197 and 199. Thus, the flow rate of the gas that can pass through the bypass line increases in the order of the bypass lines 197, 198, and 199.

The three exhaust valves 192, 193, and 194 are provided respectively in the three bypass lines 197, 198, and 199. Specifically, the exhaust valve 192 is interposed in the bypass line 197, the exhaust valve 193 is interposed in the bypass line 198, and the exhaust valve 194 is interposed in the bypass line 199. When the three exhaust valves 192, 193, and 194 are opened while the exhaust pump 191 is operated, the gas exhausted from the chamber 6 and guided by the gas exhaust pipe 88 passes through the corresponding bypass lines 197, 198, and 199 and is then sucked by the exhaust pump 191.

The three bypass lines 197, 198, and 199, which have different pipe diameters, are different in exhaust capability from each other. The exhaust capability increases as the pipe diameter increases. The exhaust capability increases in the order of the bypass lines 197, 198, and 199. Thus, the exhaust flow rate from the chamber 6 can be controlled by opening or closing any of the three exhaust valves 192, 193, and 194. Any one of the three exhaust valves 192, 193, and 194 may be opened. Alternatively, two or all of the three exhaust valves 192, 193, and 194 may be opened. For example, when the exhaust valves 193 and 194 are closed and only the exhaust valve 192 is opened, the gas is exhausted at the lowest exhaust flow rate. When all the three exhaust valves 192, 193, and 194 are opened, the gas is exhausted at the highest exhaust flow rate.

The flow regulating valve 196 is interposed between the exhaust pump 191 and the joint portion of the three bypass lines 197, 198, and 199. The exhaust flow rate in the gas exhaust pipe 88 is also regulatable by the flow regulating valve 196. The exhaust flow rate determined by the flow regulating valve 196 is variable through the control of the controller 3. While the three bypass lines 197, 198, and 199 constitute a mechanism that regulates the exhaust flow rate in a discontinuous and multi-step manner, the flow regulating valve 196 is a mechanism that regulates the exhaust flow rate in a continuous and stepless manner.

The gas supply pipe 83, the gas exhaust pipe 88, and the three bypass lines 197, 198, and 199 are made of stainless steel with high strength and high resistance to corrosion. A pressure gauge 180 for measuring the pressure in the heat treatment space 65 is provided in the chamber 6. The pressure gauge 180 preferably has a measurement range of approximately 5 Pa to 0.2 MPa.

FIG. 2 is a perspective view of the entire external appearance of a holder 7. FIG. 3 is a plan view of the holder 7 as seen from the above. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (see FIG. 1). The plurality of (in the present preferred embodiment, four) coupling portions 72 are mounted upright on the upper surface of the base ring 71 in the form of an annular ring and arranged in a circumferential direction of the base ring 71. The coupling portions 72 are also quartz members, and are rigidly secured to the base ring 71 by welding. The base ring 71 may have an arc shape that is an annular shape with a missing part.

The susceptor 74 having a planar shape is supported by the four coupling portions 72 provided on the base ring 71. The susceptor 74 is a substantially circular planar member made of quartz. The diameter of the susceptor 74 is greater than that of a semiconductor wafer W. In other words, the susceptor 74 has a size, as seen in a plan view, greater than that of the semiconductor wafer W. A plurality of (in the present preferred embodiment, five) guide pins 76 are mounted upright on the upper surface of the susceptor 74. The five guide pins 76 are located along the circumference of a circle concentric with the outer circumference of the susceptor 74. The diameter of a circle on which the five guide pins 76 are located is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by, for example, welding.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a substantially disk-shaped configuration is held in the horizontal position (the position in which the normal to the susceptor 74 coincides with a vertical direction). A semiconductor wafer W transported into the chamber 6 is placed and held in the horizontal position on the susceptor 74 of the holder 7 mounted to the chamber 6. The semiconductor wafer W is placed inside the circle defined by the five guide pins 76. This prevents a positional deviation of the semiconductor wafer W in the horizontal direction. The number of guide pins 76 is not limited to five and may be determined so as to prevent a positional deviation of the semiconductor wafer W.

As shown in FIGS. 2 and 3, an opening 78 and a cut-out portion 77 are provided in the susceptor 74 that vertically penetrate the susceptor 74. The cut-out portion 77 is provided to allow a distal end portion of a probe of a contact-type thermometer 130 including a thermocouple to pass therethrough. The opening 78 is provided for a radiation thermometer 120 to receive radiation (infrared radiation) emitted from the lower surface of the semiconductor wafer W held by the susceptor 74. The susceptor 74 further has four through holes 79 through which lift pins 12 of the transfer mechanism 10, which will be described below, pass to transfer the semiconductor wafer W.

Figure 5:
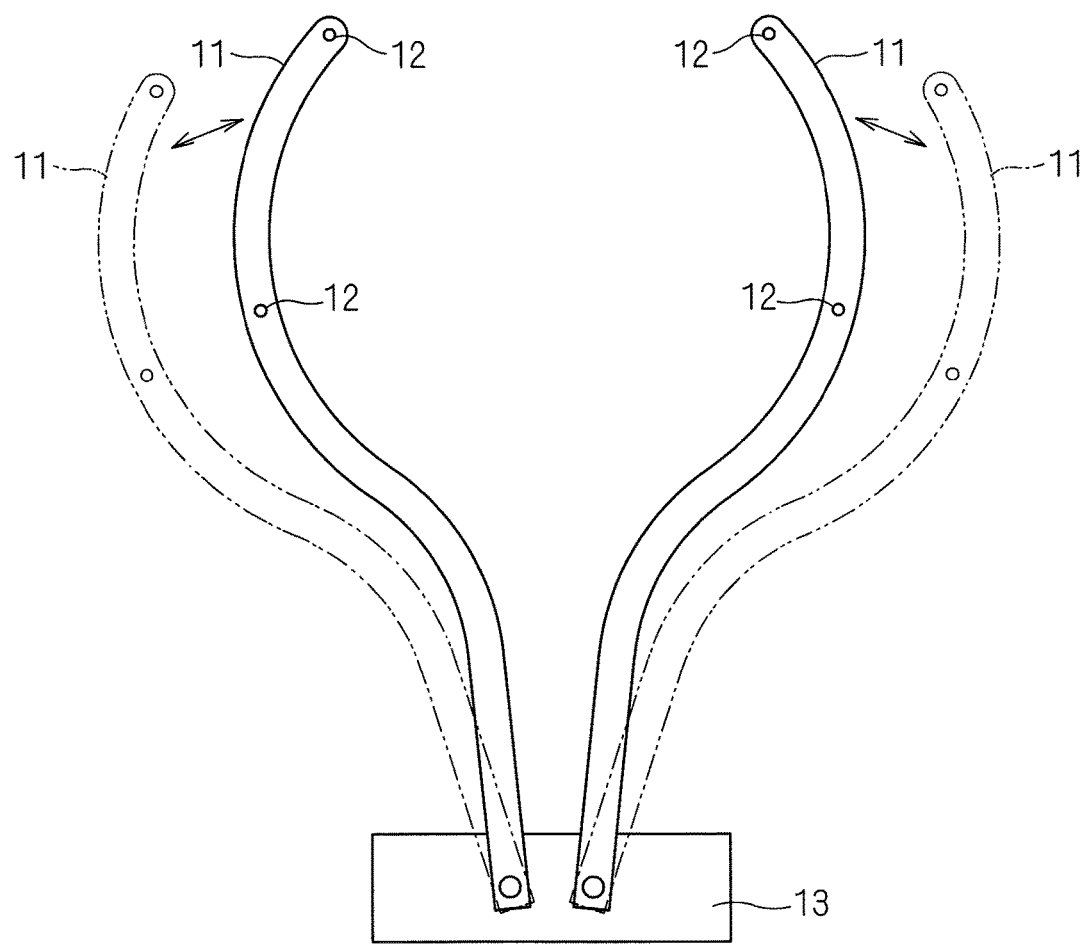
FIG. 5 is a plan view of a transfer mechanism.
Figure 6:
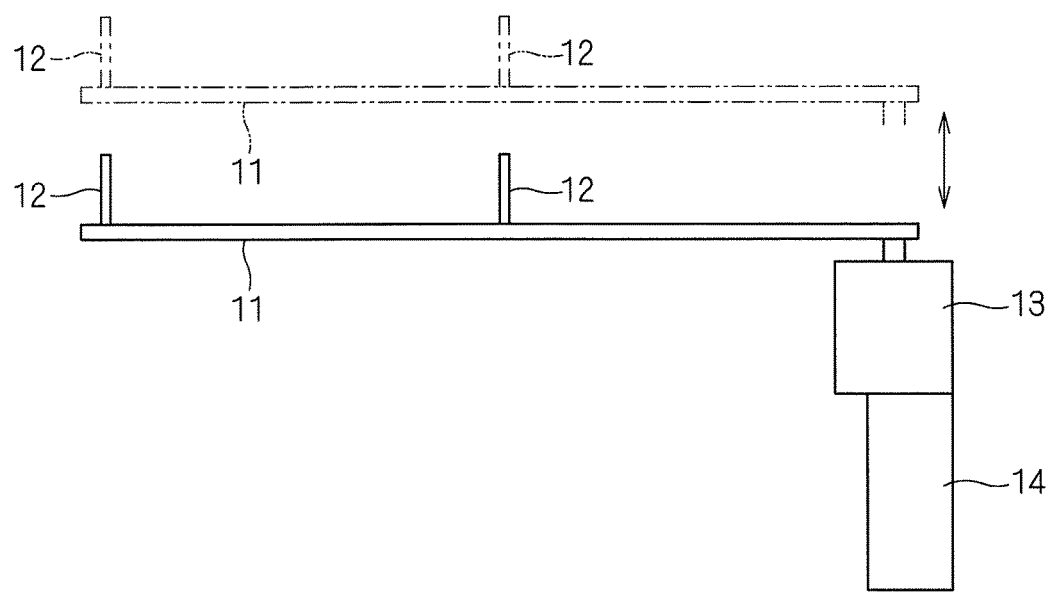
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the pair of lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dashed double-dotted lines in FIG. 5) in which the transfer arms 11 do not overlap the semiconductor wafer W held by the holder 7 as seen in a plan view. The horizontal movement mechanism 13 may be a mechanism for separately pivoting the transfer arms 11 by individual motors or a mechanism for pivoting the pair of transfer arms 11 in conjunction with each other by a single motor using a link mechanism.

The pair of transfer arms 11 are movable upward and downward together with the horizontal movement mechanism 13 by an elevating mechanism 14. When the elevating mechanism 14 moves up the pair of transfer arms 11 in their transfer operation position, the four lift pins 12 in total pass through the respective four through holes 79 (see FIGS. 2 and 3) bored in the susceptor 74, so that the upper ends of the lift pins 12 protrude from the upper surface of the susceptor 74. On the other hand, when the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is directly above the base ring 71 of the holder 7. The base ring 71 is placed on the bottom surface of the recessed portion 62, and thus, the retracted position of the transfer arms 11 is inside the recessed portion 62.

Referring back to FIG. 1, the flash heating part 5 provided over the chamber 6 includes an enclosure 51, a light source provided inside the enclosure 51 and including the plurality of (in the present preferred embodiment, 30) xenon flash lamps FL, and a reflector 52 provided inside the enclosure 51 so as to cover the light source from above. The flash heating part 5 further includes a lamp light irradiation window 53 mounted to the bottom of the enclosure 51. The lamp light irradiation window 53 forming the floor of the flash heating part 5 is a plate-shaped quartz window made of quartz. The flash heating part 5 is provided over the chamber 6, whereby the lamp light irradiation window 53 is opposed to the upper chamber window 63. The flash lamps FL emit a flash of light from over the chamber 6 through the lamp light irradiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are parallel with each other along the main surface of a semiconductor wafer W held by the holder 7 (i.e., in a horizontal direction). Thus, a plane defined by the arrangement of the flash lamps FL is also a horizontal plane.

Each of the xenon flash lamps FL includes a rod-shaped glass tube (discharge tube) and a trigger electrode. The glass tube contains a xenon gas sealed therein and has positive and negative electrodes provided on opposite ends thereof and connected to a capacitor. The trigger electrode is attached to the outer peripheral surface of the glass tube. The xenon gas is electrically insulative, and thus, no current flows in the glass tube in a normal state even when electrical charge is stored in the capacitor. However, if a high voltage is applied to the trigger electrode to cause an electrical breakdown, the electricity stored in the capacitor flows momentarily in the glass tube, and xenon atoms or molecules are excited at this time to cause light emission. Such a xenon flash lamp FL has the property of being capable of emitting extremely intense light compared with a light source that stays lit continuously, such as a halogen lamp HL, because the electrostatic energy previously stored in the capacitor is converted into an ultrashort light pulse ranging from 0.1 to 100 milliseconds. Thus, the flash lamps FL are pulsed light emitting lamps that emit light instantaneously for an extremely short time period of less than one second. The light emission time of the flash lamps FL is adjustable in accordance with the coil constant of a lamp light source that supplies power to the flash lamps FL.

The reflector 52 is provided over the plurality of flash lamps FL so as to cover all the flash lamps FL. A fundamental function of the reflector 52 is to reflect flashes of light emitted from the plurality of flash lamps FL toward the heat treatment space 65. The reflector 52 is a plate made of aluminum alloy. A surface of the reflector 52 (a surface that faces the flash lamps FL) is roughened by blasting.

The halogen heating part 4 provided below the chamber 6 includes a plurality of (in the present preferred embodiment, 40) built-in halogen lamps HL inside an enclosure 41. The halogen heating part 4 is a light irradiator that emits light from under the chamber 6 through the lower chamber window 64 toward the heat treatment space 65 to heat the semiconductor wafer W by means of the halogen lamps HL.

Figure 7:
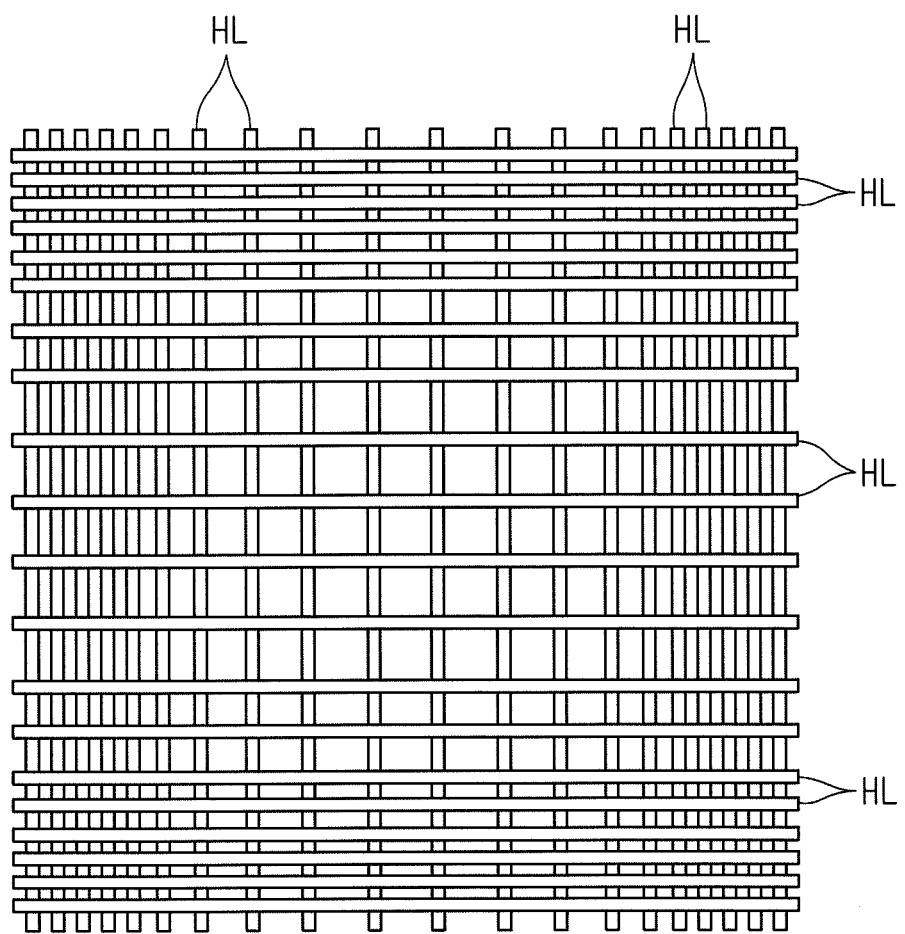
FIG. 7 is a plan view of an arrangement of halogen lamps.

FIG. 7 is a plan view of an arrangement of the plurality of halogen lamps HL. The 40 halogen lamps HL are arranged in two tiers, or, upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are parallel with each other along a main surface of a semiconductor wafer W held by the holder 7 (i.e., in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W in which a temperature drop tends to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source that passes current through a filament disposed in a glass tube to make the filament incandescent, thereby emitting light. A gas prepared by introducing a trace amount of halogen element (e.g., iodine or bromine) into an inert gas such as nitrogen or argon is sealed in the glass tube. The introduction of the halogen element allows the temperature of the filament to be set at a high temperature while restricting a break in the filament. Thus, the halogen lamps HL have the properties of having a longer life than typical incandescent lamps and being capable of continuously emitting intense light. Thus, the halogen lamps HL are continuously lighting lamps that emit light continuously for at least one second or more. In addition, the halogen lamps HL, which are rod-shaped lamps, have a longer life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4, under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program, a RAM or readable/writable memory for storing various pieces of information, and a magnetic disk for storing control software, data, and the like. The CPU of the controller 3 executes a predetermined processing program, whereby the processes in the heat treatment apparatus 1 proceed. Also, the controller 3 controls the valve 84, the valve 89, the flow regulating valve 90, the flow regulating valve 196, the exhaust pump 191, and the three exhaust valves 192, 193, and 194 to adjust the pressure in the heat treatment space 65 of the chamber 6, a gas supply flow rate to the chamber 6, and an exhaust flow rate from the chamber 6.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. For example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light irradiation window 53 to cool the flash heating part 5 and the upper chamber window 63.

A procedure for treatment of a semiconductor wafer W in the heat treatment apparatus 1 will now be described. A semiconductor wafer W to be treated herein is a semiconductor substrate including a high dielectric constant film formed thereover as a gate insulating film. The heat treatment apparatus 1 irradiates a semiconductor wafer W with a flash of light in an ammonia atmosphere to perform post deposition annealing (PDA) on the semiconductor wafer W, thereby eliminating defects in the high dielectric constant film and also nitriding the high dielectric constant film.

Figure 9:
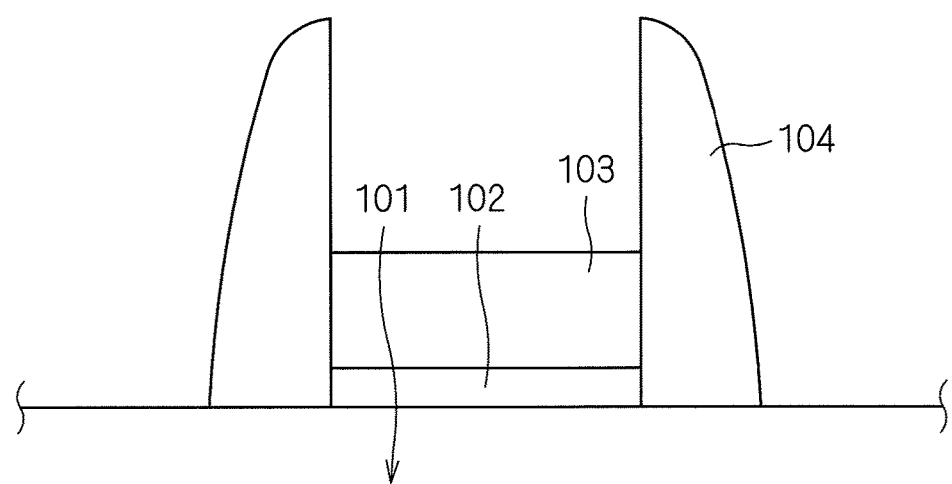
FIG. 9 is a view of a stack structure in which a high dielectric constant film is deposited over a semiconductor wafer.

FIG. 9 is a view of a stack structure in which a high dielectric constant film is deposited over a semiconductor wafer W. A silicon oxide film ($SiO_2$) 102 is formed on a base material 101 of silicon of the semiconductor wafer W. The silicon oxide film 102 is a layer required as an interfacial film between the base material 101 of silicon and a high dielectric constant film 103. The thickness of the silicon oxide film 102 is extremely small and is, for example, approximately 1 nm. Various known methods such as a thermal oxidation method may be employed as a technique for forming the silicon oxide film 102.

The high dielectric constant film 103 is formed on the silicon oxide film 102 as a gate insulating film. The material for the high dielectric constant film 103 may be a high dielectric constant material such as $HfO_2$, $ZrO_2$, $Al_2O_3$, or $La_2O_3$ (in the present preferred embodiment, $HfO_2$). The high dielectric constant film 103 is formed by, for example, depositing such a high dielectric constant material on the silicon oxide film 102 by atomic layer deposition (ALD). Although the high dielectric constant film 103 deposited on the silicon oxide film 102 has a thickness of several nanometers, the equivalent oxide thickness (EOT) of the high dielectric constant film 103 is approximately 1 nm. The technique of forming the high dielectric constant film 103 is not limited to the ALD, and for example, known techniques such as metal organic chemical vapor deposition (MOCVD) may be employed. If any technique is employed, many defects such as point defects are present in the high dielectric constant film 103 that has not undergone a specific process after deposition. In the structure of FIG. 9, side walls 104 of SiN are formed at both sides of the high dielectric constant film 103, which are formed before the formation of the high dielectric constant film 103 in, for example, the gate-last process. After the heat treatment by the heat treatment apparatus 1, titanium (Ti) or titanium nitride (TiN) is deposited as a metal gate on the high dielectric constant film 103.

The heat treatment apparatus 1 performs a heat treatment on the semiconductor wafer W including the high dielectric constant film 103 formed over the base material 101 with the silicon oxide film 102 between the base material 101 and the high dielectric constant film 103. The procedure of the operation in the heat treatment apparatus 1 will be described below. The procedure of the operation in the heat treatment apparatus 1 proceeds as the controller 3 controls the respective operating mechanisms of the heat treatment apparatus 1.

First, the semiconductor wafer W including the high dielectric constant film 103 deposited on the silicon oxide film 102 that is an interfacial film is transported into the chamber 6 of the heat treatment apparatus 1. During the transport of the semiconductor wafer W into the chamber 6, the gate valve 185 is opened to open the transport opening 66. Then, a transport robot outside the heat treatment apparatus 1 transports the semiconductor wafer W including the high dielectric constant film 103 deposited thereover through the transport opening 66 into the heat treatment space 65 of the chamber 6. In the transport, air is carried into the heat treatment space 65 of the chamber 6 along with the transport of the semiconductor wafer W into the heat treatment space 65 because the pressure inside and outside the chamber 6 is equal to atmospheric pressure. To prevent this, nitrogen gas may be continuously supplied from the gas supply source 85 into the chamber 6 by opening the valve 84 to cause the nitrogen gas to flow outwardly through the opened transport opening 66, thereby minimizing the atmosphere outside the apparatus flowing into the chamber 6. It is preferable that the supply flow rate of the nitrogen gas be higher when the gate valve 185 is open than when the semiconductor wafer W is subjected to the heat treatment (e.g., if the supply flow rate is normally 30 liters per minute during the heat treatment, the supply flow rate is 120 liters per minute when the gate valve 185 is open). It is further preferable that the supply flow rate of the nitrogen gas be increased, and at the same time, the valve 89 be closed to stop exhausting the gas from the chamber 6. This causes the nitrogen gas supplied into the chamber 6 to flow outwardly only through the transport opening 66, thereby effectively preventing outside air from flowing into the chamber 6.

The semiconductor wafer W transported into the heat treatment space 65 by the transport robot is moved forward to a position immediately over the holder 7 and is stopped thereat. Then, the pair of transfer arms 11 of the transfer mechanism 10 are moved horizontally from the retracted position to the transfer operation position and are then moved upwardly, so that the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 move downwardly to transfer the semiconductor wafer W from the transfer mechanism 10 to the susceptor 74 of the holder 7, so that the semiconductor wafer W is held in a horizontal position. The semiconductor wafer W is held on the susceptor 74 in such a position that a front surface thereof over which the high dielectric constant film 103 is deposited is the upper surface. Also, the semiconductor wafer W is held inside the five guide pins 76 on the upper surface of the susceptor 74. The pair of transfer arms 11 moved downwardly below the susceptor 74 are moved back to the retracted position, that is, to the inside of the recessed portion 62, by the horizontal movement mechanism 13.

After the semiconductor wafer W is housed in the chamber 6 and the transport opening 66 is closed by the gate valve 185, the pressure in the chamber 6 is reduced to a pressure lower than atmospheric pressure. Specifically, the transport opening 66 is closed, so that the heat treatment space 65 in the chamber 6 becomes an enclosed space. In this state, the valve 89 for exhausting the gas is opened while the valve 84 for supplying the gas is closed. The controller 3 opens the exhaust valve 192 provided in the bypass line 197 having the smallest pipe diameter among the three bypass lines 197, 198, and 199 while operating the exhaust pump 191. The other exhaust valves 193 and 194 are closed. Thus, the gas is exhausted from the chamber 6 while no gas is supplied into the chamber 6, so that the pressure in the heat treatment space 65 in the chamber 6 is reduced.

Figure 10:
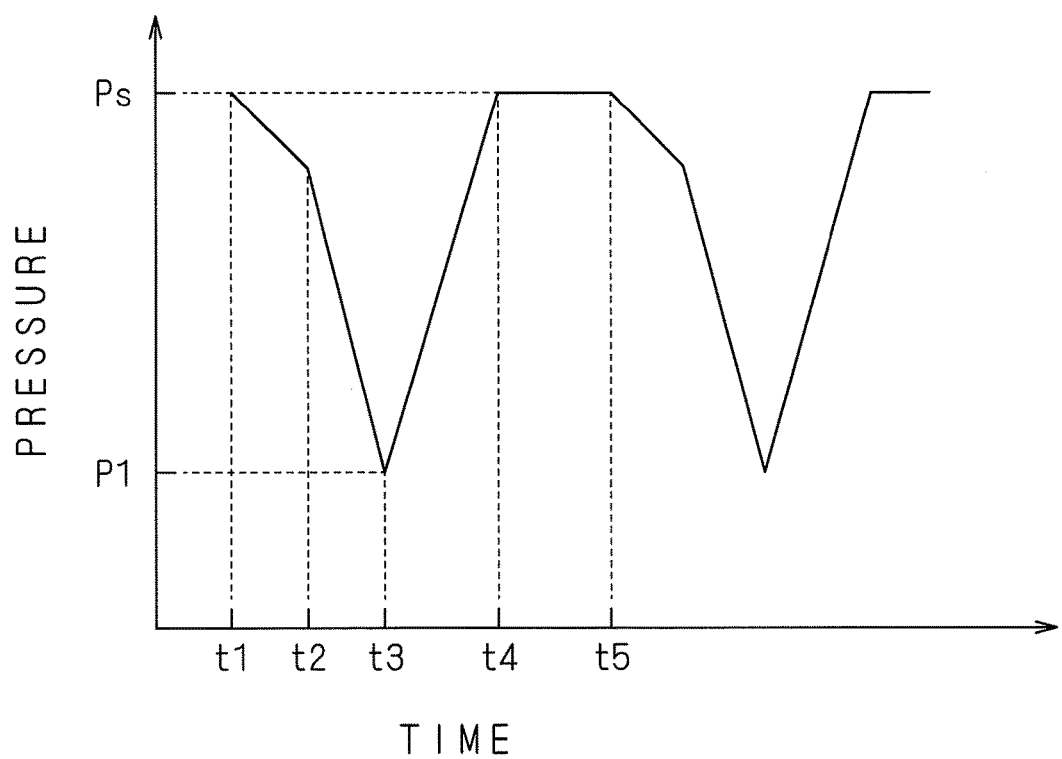
FIG. 10 is a graph showing changes in pressure in a chamber according to a first preferred embodiment of the present invention.

FIG. 10 is a graph showing changes in pressure in the chamber 6 according to the first preferred embodiment. In FIG. 10, the horizontal axis represents time, and the vertical axis represents pressure in the chamber 6. At the time when the semiconductor wafer W is housed in the chamber 6 and the transport opening 66 is closed, the pressure in the chamber 6 is equal to ordinary pressure Ps (=atmospheric pressure=approximately 101325 Pa). Then, at a time t1, a reduction in pressure in the chamber 6 starts. In an early stage of the pressure reduction, only the bypass line 197 having the smallest pipe diameter among the three bypass lines 197, 198, and 199 is used, so that an exhaust flow rate is low and an exhaust speed is relatively low.

Then, at a time t2, the controller 3 opens all the three exhaust valves 192, 193, and 194. As a result, the exhaust flow rate from the chamber 6 increases, and the exhaust speed becomes faster. Then, at a time t3, the pressure (degree of vacuum) in the chamber 6 becomes equal to a pressure P1. The pressure P1 is, for example, approximately 100 Pa. That is, after the gas is exhausted at a low exhaust flow rate in the early stage of the pressure reduction, the exhaust flow rate is changed to a higher exhaust flow rate, and the gas is exhausted at the higher exhaust flow rate. The flow rate in the flow regulating valve 196 is constant in the first preferred embodiment.

If the gas is exhausted rapidly at a high exhaust flow rate from the start of the pressure reduction, there is a danger that a large gas flow change may occur in the chamber 6 to cause particles deposited on structures (e.g., the lower chamber window 64) of the chamber 6 to swirl up and be deposited again on the semiconductor wafer W, resulting in contamination of the semiconductor wafer W. When the exhaust flow rate is changed to a higher exhaust flow rate and the gas is exhausted at the higher exhausted flow rate after the gas is exhausted gently at a low exhaust flow rate in the early stage of the pressure reduction, the swirling-up of particles in the chamber 6 is prevented.

When the exhaust part 190, which includes a detoxifying device (not shown) that renders the reactive gas such as ammonia harmless, exhausts the gas at a high exhaust flow rate from the start of the pressure reduction, a large amount of gas may flow into the detoxifying device, so that the detoxifying device may become overloaded. The detoxifying device can be prevented from becoming overloaded by exhausting the gas at a low exhaust flow rate in the early stage of the pressure reduction and then changing the exhaust flow rate to a higher exhaust flow rate to exhaust the gas, as in the present preferred embodiment. If the gas is exhausted at a high exhaust flow rate after the pressure in the chamber 6 decreases to some extent, a relatively small amount of gas flows into the exhaust part 190.

At the time t3 when the pressure in the chamber 6 becomes equal to the pressure P1, the valve 89 for exhausting the gas is closed and the valve 84 for supplying the gas is opened, so that the gaseous mixture of ammonia and nitrogen gas that is a dilute gas is supplied into the heat treatment space 65 of the chamber 6. As a result, an ammonia atmosphere is provided around the semiconductor wafer W held by the holder 7 in the chamber 6. The concentration of ammonia in the ammonia atmosphere (i.g., the mixing ratio of ammonia and nitrogen gas) is not particularly limited and may be any value, which is, for example, not greater than 10 vol % (in the present preferred embodiment, approximately 2.5 vol %). Also while the gaseous mixture of ammonia and nitrogen is supplied into the chamber 6, only the bypass line 197 having the smallest pipe diameter may be used to exhaust the gas from the chamber 6. In this case, needless to say, the supply flow rate of the gaseous mixture is higher than the exhaust flow rate thereof.

By supplying the gaseous mixture into the chamber 6, the pressure in the chamber 6 is increased from the pressure P1 to return to the ordinary pressure Ps at a time t4. In the first preferred embodiment, the pressure in the chamber 6 is reduced once to the pressure P1 and then returned to the ordinary pressure Ps. This results in an oxygen concentration of not greater than approximately 200 ppb in the ammonia atmosphere in the chamber 6 after the pressure return to the ordinary pressure Ps.

After the time t4 when the pressure in the chamber 6 is returned to the ordinary pressure Ps, the supply flow rate of the gaseous mixture of ammonia and nitrogen to the chamber 6 and the exhaust flow rate thereof from the chamber 6 are made equal to each other, so that the pressure in the chamber 6 is maintained at the ordinary pressure Ps.

At the time t4 when the pressure in the chamber 6 is returned to the ordinary pressure Ps, the 40 halogen lamps HL of the halogen heating part 4 turn on simultaneously to start preheating (or assist-heating) the semiconductor wafer W. The halogen light emitted from the halogen lamps HL is transmitted through the lower chamber window 64 and the susceptor 74 that are made of quartz, and impinges upon the back surface of the semiconductor wafer W. The back surface of the semiconductor wafer W refers to a main surface thereof opposite to the front surface with the high dielectric constant film 103 deposited thereover. The semiconductor wafer W is irradiated with the halogen light from the halogen lamps HL, so that the temperature of the semiconductor wafer W increases. It should be noted that the transfer arms 11 of the transfer mechanism 10, which have been retracted to the inside of the recessed portion 62, do not block the heating using the halogen lamps HL.

The temperature of the semiconductor wafer W is measured with the contact-type thermometer 130 when the halogen lamps HL perform the preheating. Specifically, the contact-type thermometer 130 including a built-in thermocouple comes through the cut-out portion 77 into contact with the lower surface of the semiconductor wafer W held by the susceptor 74 to measure the temperature of the semiconductor wafer W that is during a temperature rise. The measured temperature of the semiconductor wafer W is transmitted to the controller 3. The controller 3 controls the output from the halogen lamps HL while monitoring whether the temperature of the semiconductor wafer W, which is during a temperature rise by the irradiation with light of the halogen lamps HL, reaches a predetermined preheating temperature T1. In other words, the controller 3 performs feedback control on the output of the halogen lamps HL, based on the value measured with the contact-type thermometer 130, so that the temperature of the semiconductor wafer W is equal to the preheating temperature T1. The preheating temperature T1 is in the range of 300° C. to 600° C., and is 450° C. in the present preferred embodiment. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the accurate measurement of the temperature.

After the temperature of the semiconductor wafer W reaches the preheating temperature T1, the controller 3 maintains the temperature of the semiconductor wafer W at the preheating temperature T1 for a short time. Specifically, at the time when the temperature of the semiconductor wafer W measured with the contact-type thermometer 130 reaches the preheating temperature T1, the controller 3 adjusts the output of the halogen lamps HL to maintain the temperature of the semiconductor wafer W at approximately the preheating temperature T1.

Such preheating using the halogen lamps HL uniformly increases the temperature of the entire semiconductor wafer W including the high dielectric constant film 103 to the preheating temperature T1. In the preheating stage using the halogen lamps HL, the semiconductor wafer W shows a tendency to be lower in temperature in a peripheral portion thereof where heat dissipation tends to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation tends to occur, thereby providing a uniform in-plane temperature distribution of the semiconductor wafer W in the preheating stage. Further, the inner peripheral surface of the reflection ring 69 mounted to the chamber side portion 61 is provided as a mirror surface. Thus, a greater amount of light is reflected from the inner peripheral surface of the reflection ring 69 toward the peripheral portion of the semiconductor wafer W. This leads to a more uniform in-plane temperature distribution of the semiconductor wafer W in the preheating stage. It should be noted that the pressure in the chamber 6 during the preheating is maintained at the ordinary pressure Ps.

Then, the flash lamps FL emit a flash of light to perform a flash heating treatment at a time t5 when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating treatment of the semiconductor wafer W.

The flash heating treatment, which is achieved by the emission of a flash of light from the flash lamps FL, can increase the temperature of the front surface of the semiconductor wafer W in a short time. Specifically, the flash of light emitted from the flash lamps FL is an intense flash of light emitted for an extremely short period of time ranging from about 0.1 to 100 milliseconds as a result of the conversion of the electrostatic energy previously stored in the capacitor into such an ultrashort light pulse. By irradiating the front surface of the semiconductor wafer W, which includes the high dielectric constant film 103 deposited over the base material 101 with the silicon oxide film 102 between the base material 101 and the high dielectric constant film 103, with a flash of light from the flash lamps FL, the temperature of the front surface of the semiconductor wafer W including the high dielectric constant film 103 is momentarily increased to the treatment temperature T2, so that the post deposition annealing is performed. The treatment temperature T2 that is a maximum temperature (peak temperature) reached by the temperature of the front surface of the semiconductor wafer W subjected to irradiation with a flash of light is in the range of 600° C. to 1200° C., and is 1000° C. in the present preferred embodiment.

When the temperature of the front surface of the semiconductor wafer W rises to the treatment temperature T2 in the ammonia atmosphere and the post deposition annealing is performed, nitriding of the high dielectric constant film 103 is accelerated, and defects such as point defects present in the high dielectric constant film 103 disappear. The light emission time of the flash lamps FL is a short time period ranging from approximately 0.1 to 100 milliseconds. The time required for the temperature of the front surface of the semiconductor wafer W to increase from the preheating temperature T1 to the treatment temperature T2 is also accordingly an extremely short time period of less than one second. After the flash irradiation, the temperature of the front surface of the semiconductor wafer W rapidly decreases from the treatment temperature T2.

After the flash heating treatment, the valve 84 for supplying the gas is closed to reduce the pressure in the chamber 6 again. The pattern of the pressure reduction at this time is identical to the pattern of the pressure reduction from the time t1 to the time t3 as described above. Specifically, in the early stage of the pressure reduction, only the bypass line 197 having the smallest pipe diameter among the three bypass lines 197, 198, and 199 is used, so that the exhaust flow rate is reduced to be relatively low. After that, all the three exhaust valves 192, 193, and 194 are opened to increase the exhaust flow rate. That is, after the gas is exhausted at a low exhaust flow rate in the early stage of the pressure reduction, the exhaust flow rate is changed to a higher exhaust flow rate, and then the gas is exhausted at the higher exhaust flow rate. The reason why the exhaust flow rate is changed in two stages to exhaust the gas as described is similar to the above.

Reducing the pressure in the chamber 6 to the pressure P1 again can discharge harmful ammonia from the heat treatment space 65 in the chamber 6. Subsequently, the valve 89 for exhausting the gas is closed and the valve 84 for supplying the gas is opened to supply a nitrogen gas from the gas supply source 85 to the chamber 6, thereby returning the pressure in the chamber 6 to the ordinary pressure Ps. At this time, the supply flow rate of the nitrogen gas is not less than 50 liters per minute. The halogen lamps HL also turn off, so that the temperature of the semiconductor wafer W also decreases from the preheating temperature T1. The contact-type thermometer 130 or the radiation thermometer 120 measures the temperature of the semiconductor waver W which is on the decrease. The result of the measurement is transmitted to the controller 3. The controller 3 monitors whether the temperature of the semiconductor wafer W has decreased to a predetermined temperature, based on the result of the measurement. After the temperature of the semiconductor wafer W decreases to the predetermined temperature or below, the pair of transfer arms 11 of the transfer mechanism 10 are moved horizontally again from the retracted position to the transfer operation position and are then moved upwardly, so that the lift pins 12 protrude from the upper surface of the susceptor 74 to receive the heat-treated semiconductor wafer W from the susceptor 74. Subsequently, the transport opening 66 that has been closed by the gate valve 185 is opened, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the first preferred embodiment, the pressure in the chamber 6 is reduced once to the pressure P1 lower than atmospheric pressure and then returned to the ordinary pressure Ps by supplying the gaseous mixture of ammonia and nitrogen. This results in an oxygen concentration of not greater than approximately 200 ppb in the chamber 6 after the pressure return to the ordinary pressure Ps. If the atmosphere in the chamber 6 is replaced with the gaseous mixture of ammonia and nitrogen while the pressure in the chamber 6 is not reduced but is maintained at ordinary pressure, the limit to which the oxygen concentration in the chamber 6 can be decreased is approximately 2 ppm. That is, the process of reducing the pressure in the chamber 6 once to the pressure P1 and thereafter returning the pressure in the chamber 6 to the ordinary pressure Ps as in the present preferred embodiment reduces the oxygen concentration in the chamber 6 to approximately one-tenth of that in the process in which the pressure reduction is not performed.

As described above, since many defects such as point defects are present in the high dielectric constant film 103 that has not undergone a specific process after deposition, such defects need to be reduced by post deposition annealing (PDA). In the presence of oxygen in the post deposition annealing, the oxygen may be taken in to allow the silicon oxide film 102 underlying the high dielectric constant film 103 to grow, resulting in an increased film thickness. Consequently, a high dielectric constant cannot be achieved. Oxygen remaining in the chamber 6 is a particular problem as a cause of such an increase in film thickness. When the semiconductor wafer W is transported into the chamber 6 at ordinary pressure as in the present preferred embodiment, a large amount of outside air is carried into the chamber 6 to increase the residual oxygen concentration in the chamber 6. It is thus preferable to minimize the oxygen concentration in the atmosphere during the post deposition annealing for the high dielectric constant film 103. In particular, the oxygen concentration is desirably not greater than 1 ppm in the formation of a recent high dielectric constant gate insulating film.

In the first preferred embodiment, the pressure in the chamber 6 is reduced once to the pressure P1 lower than atmospheric pressure and then returned to the ordinary pressure Ps, so that the oxygen concentration in the heat treatment space 65 of the chamber 6 during the post deposition annealing for the high dielectric constant film 103 is decreased to approximately 200 ppb or less. This restricts an increase in thickness of the silicon oxide film 102 underlying the high dielectric constant film 103, which results from the oxygen taken in from the heat treatment space 65 during the post deposition annealing.

The high dielectric constant film 103 immediately after deposition contains oxygen, and thus, if the treatment time of the post deposition annealing becomes on the order of several seconds or more, the oxygen may diffuse to increase the thickness of the silicon oxide film 102. In the first preferred embodiment, the front surface of the semiconductor wafer W is irradiated with a flash of light in the irradiation time of less than one second from the flash lamps FL to raise the temperature of the front surface of the wafer in an extremely short time period, and thus, there is no time for oxygen to diffuse. This restricts an increase in thickness of the silicon oxide film 102 underlying the high dielectric constant film 103.

In the first preferred embodiment, the gaseous mixture of ammonia and nitrogen is introduced when the pressure in the chamber 6 is returned to the ordinary pressure Ps, so that the front surface of the semiconductor wafer W is irradiated with a flash of light from the flash lamps FL in the ammonia atmosphere to perform the post deposition annealing. Heating the high dielectric constant film 103 to the treatment temperature T2 in the ammonia atmosphere causes nitriding of the high dielectric constant film 103 to proceed. This reduces the defects present in the high dielectric constant film 103 after the deposition, thus restricting a leakage current associated with these defects.

Performing the flash heating treatment in the ammonia atmosphere nitrides the silicon oxide film 102 underlying the high dielectric constant film 103. Nitriding of the silicon oxide film 102 more effectively restricts an increase in the thickness due to the oxidation of the silicon oxide film 102. Nitriding of the silicon oxide film 102 slightly increases the dielectric constant of the silicon oxide film 102. This restricts an increase in physical thickness of the silicon oxide film 102 and also reduces the electrical thickness thereof. The flash irradiation time, which is an extremely short time of not greater than one second, restricts the diffusion of nitrogen to the channel side even when the silicon oxide film 102 is nitrided.

As described above, in pressure reduction in the chamber 6, the gas is exhausted at a low exhaust flow rate in the start of pressure reduction, and then, the exhaust flow rate is changed to a high exhaust flow rate to exhaust the gas. This prevents the particles from swirling up in the chamber 6 and also prevents the detoxifying device of the exhaust part 190 from becoming overloaded.

Second Preferred Embodiment

A second preferred embodiment of the present invention will now be described. The heat treatment apparatus 1 of the second preferred embodiment is identical in configuration to that of the first preferred embodiment. The procedure for treatment of a semiconductor wafer W in the heat treatment apparatus 1 of the second preferred embodiment is substantially identical to that of the first preferred embodiment. The second preferred embodiment differs from the first preferred embodiment in the pressure to which the pressure in the chamber 6 is returned after being decreased once.

Figure 11:
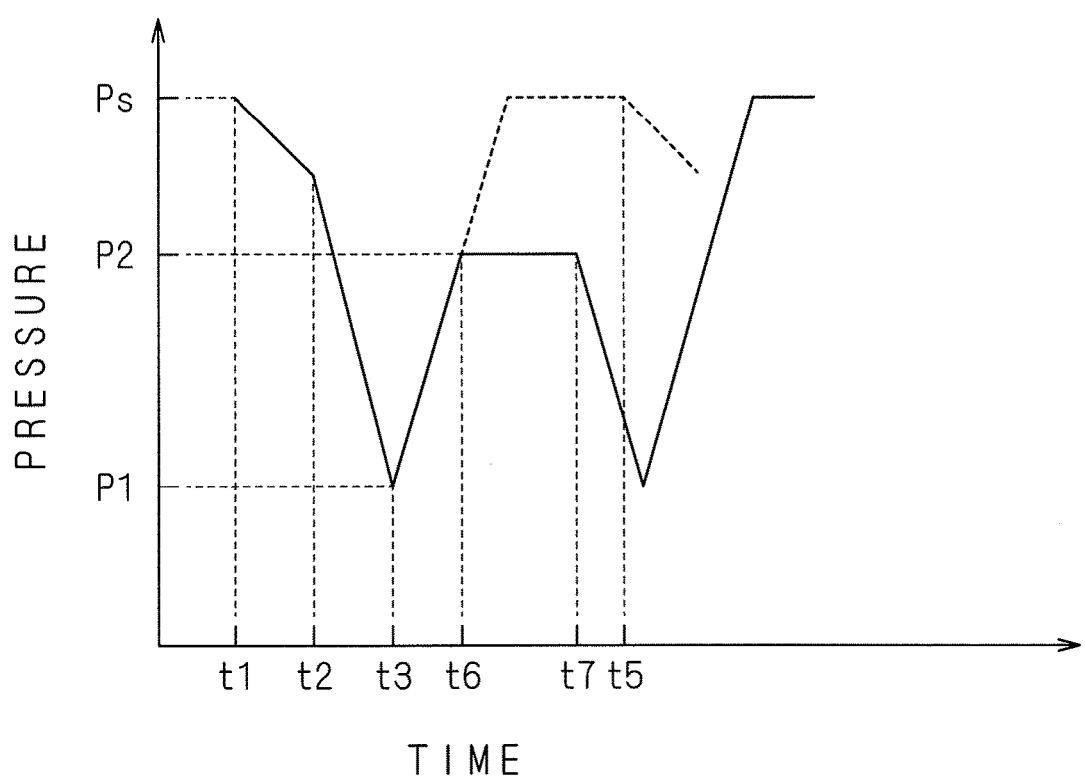
FIG. 11 is a graph showing changes in pressure in the chamber according to a second preferred embodiment of the present invention.

FIG. 11 is a graph showing changes in pressure in the chamber 6 according to the second preferred embodiment. In FIG. 11, the horizontal axis represents time, and the vertical axis represents pressure in the chamber 6, as in FIG. 10. Indicated by the dotted lines in FIG. 11 is a pressure change pattern obtained when the pressure in the chamber 6 according to the first preferred embodiment is returned to the ordinary pressure Ps (the pattern of FIG. 10).

At the time when the semiconductor wafer W including the high dielectric constant film 103 deposited thereover is housed in the chamber 6 and the transport opening 66 is closed, the pressure in the chamber 6 is equal to the ordinary pressure Ps (=atmospheric pressure=approximately 101325 Pa), as in the first preferred embodiment. Then, the reduction in pressure in the chamber 6 starts at the time t1. After the gas is exhausted at a low exhaust flow rate in the early stage of the pressure reduction, the exhaust flow rate is changed to a higher exhaust flow rate at the time t2, and the gas is exhausted at the higher exhaust flow rate, as in the first preferred embodiment. This prevents particles from swirling up in the chamber 6 and also prevents the detoxifying device from becoming overloaded.

At the time t3 when the pressure in the chamber 6 is equal to the pressure P1, the valve 89 for exhausting the gas is closed and the valve 84 for supplying the gas is opened, so that the gaseous mixture of ammonia and nitrogen gas that is a diluent gas is supplied from the gas supply source 85 into the heat treatment space 65 of the chamber 6. The operation thus far described is similar to that of the first preferred embodiment. The pressure P1 is, for example, approximately 100 Pa.

In the second preferred embodiment, the pressure in the chamber 6 is not returned to the ordinary pressure Ps but is returned to a pressure P2 at a time t6 by supplying the gaseous mixture. The pressure P2 is higher than the pressure P1 and lower than the ordinary pressure Ps. The pressure P2 is, for example, approximately 5000 Pa. Also in the second preferred embodiment, the pressure in the chamber 6 is reduced once to the pressure P1 and then returned to the pressure P2 higher than the pressure P1. This results in an oxygen concentration of not greater than approximately 200 ppb in the chamber 6 after the pressure return to the pressure P2.

After the time t6 when the pressure in the chamber 6 is returned to the pressure P2, the supply flow rate of the gaseous mixture of ammonia and nitrogen to the chamber 6 and the exhaust flow rate thereof from the chamber 6 are made equal to each other, so that the pressure in the chamber 6 is maintained at the pressure P2. While the pressure in the chamber 6 is maintained at the pressure P2, the preheating of the semiconductor wafer W is performed by the halogen lamps HL, and the flash heating treatment is thereafter performed at a time t7 by irradiating the front surface of the semiconductor wafer W with a flash of light from the flash lamps FL. The details of the preheating and the flash heating treatment in the second preferred embodiment are identical to those in the first preferred embodiment. The temperature of the front surface of the semiconductor wafer rises to the treatment temperature T2 by flash irradiation in the ammonia atmosphere, so that post deposition annealing for the high dielectric constant film 103 is performed.

After the flash heating treatment, the valve 84 for supplying the gas is closed to reduce the pressure in the chamber 6 to the pressure P1 again, so that harmful ammonia is discharged from the heat treatment space 65 of the chamber 6. Subsequently, the valve 89 for exhausting the gas is closed and the valve 84 for supplying the gas is opened, so that the nitrogen gas is supplied from the gas supply source 85 into the chamber 6 to return the pressure in the chamber 6 to the ordinary pressure Ps. The halogen lamps HL turn off. This causes the temperature of the semiconductor wafer W to decrease from the preheating temperature T1. The procedure for the subsequent transport of the semiconductor wafer W, the temperature of which has been decreased to a predetermined temperature, out of the chamber 6 of the heat treatment apparatus 1 in the second preferred embodiment is similar to that in the first preferred embodiment.

In the second preferred embodiment, the pressure in the chamber 6 is reduced once to the pressure P1 lower than atmospheric pressure and then returned to the pressure P2 by supplying the gaseous mixture of ammonia and nitrogen into the chamber 6, resulting in an oxygen concentration of not greater than approximately 200 ppb in the heat treatment space 65 of the chamber 6 during the post deposition annealing for the high dielectric constant film 103, as in the first preferred embodiment. This restricts an increase in thickness of the silicon oxide film 102 underlying the high dielectric constant film 103 due to the oxygen taken in from the heat treatment space 65 during the post deposition annealing.

As in the first preferred embodiment, the temperature of the front surface of the semiconductor wafer W is increased to the treatment temperature T2 in an extremely short time by irradiating the front surface of the semiconductor wafer W with a flash of light from the flash lamps FL for an irradiation time period of less than one second. This results in an extremely short treatment time for the post deposition annealing and does not allow time for oxygen to diffuse. Thus, an increase in thickness of the silicon oxide film 102 underlying the high dielectric constant film 103 is restricted.

In the second preferred embodiment, the post deposition annealing is performed on the high dielectric constant film 103 by irradiating the front surface of the wafer W with a flash of light, with the pressure in the chamber 6 maintained at the pressure p2 lower than ordinary pressure, that is, under an increased pressure. Under a reduced pressure, the density of gas molecules is small, resulting in a longer mean free path. When the post deposition annealing is performed on the high dielectric constant film 103 under a reduced pressure, accordingly, the mean free path of ammonia is increased, resulting in a uniform reaction of ammonia and the high dielectric constant film 103 to the heat treatment. Needless to say, when the post deposition annealing is performed on the high dielectric constant film 103 under a reduced pressure, the partial pressure itself of ammonia is reduced remarkably compared with the case in which the treatment is performed at ordinary pressure as in the first preferred embodiment. For this reason, nitriding of the high dielectric constant film 103 proceeds further when the post deposition annealing is performed on the high dielectric constant film 103 at ordinary pressure as in the first preferred embodiment.

Performing the post deposition annealing on the high dielectric constant film 103 under a reduced pressure promotes the desorption of impurities, for example, carbon (C), contained in the high dielectric constant film 103 after the deposition. By discharging such desorbed impurity elements from the chamber 6, the impurities are prevented from being deposited again on and contaminating the front surface of the semiconductor wafer W. This prevents the degradation in device performance and a decrease in yield.

Also, the temperature rise efficiency is enhanced during the preheating and during the flash heating treatment because the absorption of halogen lamp light and flashes of light by an atmosphere gas in the chamber 6 is reduced. This also increases the attained surface temperature of the semiconductor wafer W during the flash heating treatment.

Performing the heating treatment on the semiconductor wafer W under a reduced pressure reduces the influence of convection in the chamber 6 to improve the uniformity of the in-plane temperature distribution of the semiconductor wafer W.

In the second preferred embodiment, the pressure in the chamber 6 is not returned to the ordinary pressure Ps but is returned from the pressure P1 to the pressure P2 lower than atmospheric pressure. The time required for the pressure return is made shorter by the return of the pressure in the chamber 6 to the pressure P2 as in the second preferred embodiment than by the return of the pressure in the chamber 6 to the ordinary pressure Ps as in the first preferred embodiment. The timing of the flash irradiation may be moved forward by the amount of the reduction in the time required for the pressure return (as shown in FIG. 11, the time t7 of the flash irradiation in the second preferred embodiment is earlier than the time t5 of the flash irradiation in the first preferred embodiment). As a result, the return of the pressure in the chamber 6 to the pressure P2 lower than atmospheric pressure as in the second preferred embodiment improves the throughput in the heat treatment apparatus 1.

Third Preferred Embodiment

A third preferred embodiment of the present invention will now be described. The heat treatment apparatus 1 of the third preferred embodiment is exactly identical in configuration to that of the first preferred embodiment. The procedure for treatment of the semiconductor wafer W in the heat treatment apparatus 1 of the third preferred embodiment is substantially similar to that of the first preferred embodiment. The third preferred embodiment differs from the first preferred embodiment in pressure changes in the chamber 6.

Figure 12:
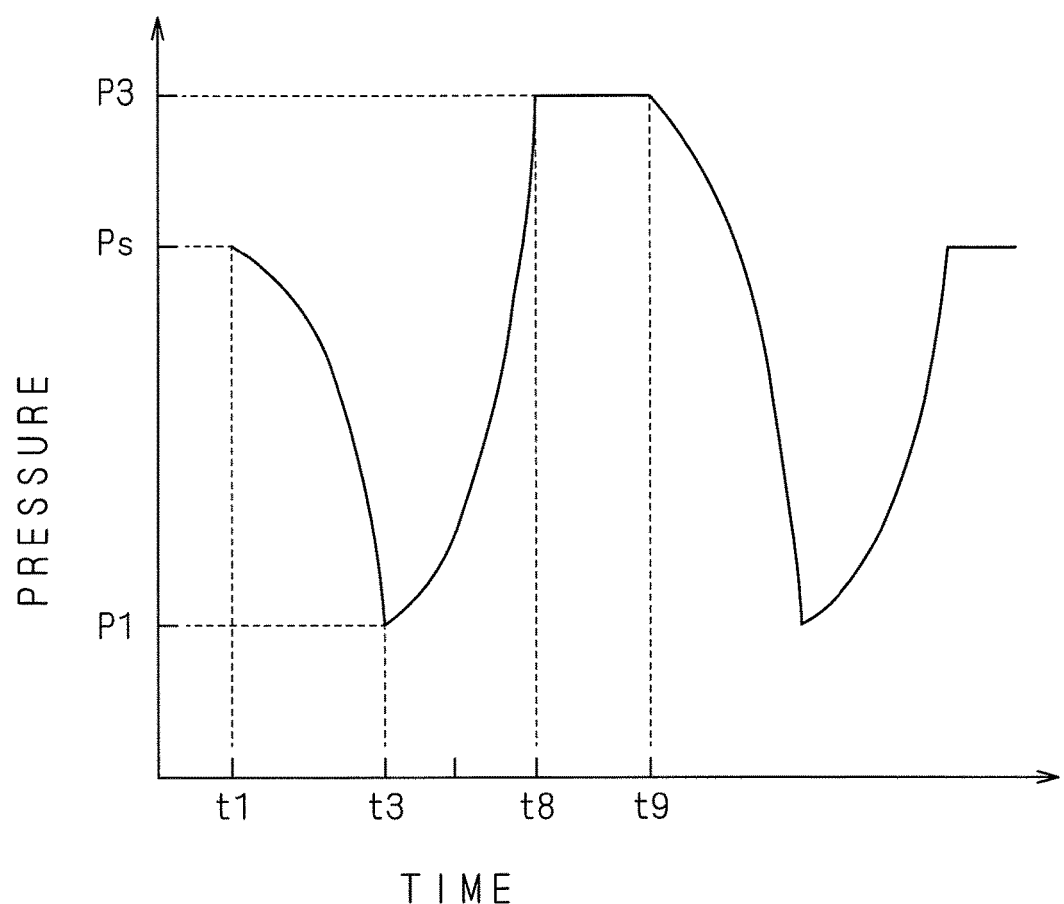
FIG. 12 is a graph showing changes in pressure in the chamber according to a third preferred embodiment of the present invention.

FIG. 12 is a graph showing changes in pressure in the chamber 6 according to the third preferred embodiment. In FIG. 12, the horizontal axis represents time, and the vertical axis represents pressure in the chamber 6, as in FIG. 10.

At the time when the semiconductor wafer W including the high dielectric constant film 103 deposited thereover is housed in the chamber 6 and the transport opening 66 is closed, the pressure in the chamber 6 is equal to the ordinary pressure Ps (=atmospheric pressure=approximately 101325 Pa), as in the first preferred embodiment. Then, the reduction in pressure in the chamber 6 starts at the time t1. In the third preferred embodiment, the exhaust flow rate in the three bypass lines 197, 198, and 199 is made constant, and the exhaust flow rate from the chamber 6 is continuously increased with time by means of the flow regulating valve 196. That is, the exhausting of the gas starts at a relatively low exhaust flow rate in the early stage of the pressure reduction, and the exhaust flow rate is increased gradually continuously. This prevents particles from swirling up in the chamber 6 and also prevents the detoxifying device from becoming overloaded, as in the first preferred embodiment. Also, increasing the exhaust flow rate in a continuous and stepless manner prevents particles from swirling up due to abrupt changes in exhaust flow rate.

At the time t3 when the pressure in the chamber 6 is equal to the pressure P1, the valve 89 for exhausting the gas is closed and the valve 84 for supplying the gas is opened, so that the gaseous mixture of ammonia and nitrogen gas that is a diluted gas is supplied from the gas supply source 85 into the heat treatment space 65 of the chamber 6 to return the pressure in the chamber 6. The pressure P1 is, for example, approximately 100 Pa.

In the third preferred embodiment, the supply flow rate of the treatment gas to the chamber 6 is continuously increased with time by means of the flow regulating valve 90. That is, the supply of the gas starts at a relatively low supply flow rate in the early stage of the pressure return, and the supply flow rate is increased gradually continuously. If the gas is supplied rapidly at a high supply flow rate from the start of the pressure return, there is a danger that particles deposited on the structures of the chamber 6 may swirl up, as in the case of the pressure reduction. When the supply of the gas starts at a relatively low supply flow rate in the early stage of the pressure return and the supply flow rate is increased gradually, such particles in the chamber 6 are prevented from swirling up. Also, increasing the supply flow rate in a continuous and stepless manner prevents particles from swirling up due to abrupt changes in supply flow rate.

In the third preferred embodiment, the pressure in the chamber 6 is returned to a pressure P3 exceeding the ordinary pressure Ps at a time t8 by supplying the gaseous mixture into the chamber 6. The pressure P3 is higher than atmospheric pressure and is, for example, approximately 0.15 MPa. Also in the third preferred embodiment, the pressure in the chamber 6 is reduced once to the pressure P1 and then returned to the pressure P3 higher than the pressure P1. This results in an oxygen concentration of not greater than approximately 200 ppb in the chamber 6 after the pressure return to the pressure P3.

After the time t8 when the pressure in the chamber 6 is returned to the pressure P3, the supply flow rate of the gaseous mixture of ammonia and nitrogen to the chamber 6 and the exhaust flow rate thereof from the chamber 6 are made equal to each other, so that the pressure in the chamber 6 is maintained at the pressure P3. While the pressure in the chamber 6 is maintained at the pressure P3, the preheating of the semiconductor wafer W is performed by the halogen lamps HL, and the flash heating treatment is thereafter performed at a time t9 by irradiating the front surface of the semiconductor wafer W with a flash of light from the flash lamps FL. The details of the preheating and the flash heating treatment in the third preferred embodiment are identical to those in the first preferred embodiment. By irradiating the front surface of the semiconductor wafer W with a flash of light in the ammonia atmosphere, the post deposition annealing on the high dielectric constant film 103 is performed.

After the flash heating treatment, the valve 84 for supplying the gas is closed to reduce the pressure in the chamber 6 to the pressure P1 again, so that harmful ammonia is discharged from the heat treatment space 65 of the chamber 6. Also at this time, the exhaust flow rate from the chamber 6 is continuously increased with time by means of the flow regulating valve 196, thus preventing the particles from swirling up due to the gas exhaustion.

Subsequently, the valve 89 for exhausting the gas is closed and the valve 84 for supplying the gas is opened to supply the nitrogen gas into the chamber 6 from the gas supply source 85, thereby returning the pressure in the chamber 6 to the ordinary pressure Ps. The supply flow rate of the treatment gas to the chamber 6 is continuously increased with time by means of the flow regulating valve 90, thus preventing the particles from swirling up due to the gas exhaustion.

The halogen lamps HL turn off, so that the temperature of the semiconductor wafer W decreases from the preheating temperature T1. The procedure for the subsequent transport of the semiconductor wafer W, the temperature of which has been decreased to a predetermined temperature, out of the chamber 6 of the heat treatment apparatus 1 in the third preferred embodiment is similar to that in the first preferred embodiment.

Factors responsible for the particles swirling up in the chamber 6 include the flash irradiation in addition to the gas supplied to and exhausted from the chamber 6. In the flash irradiation from the flash lamps FL, the temperature of the front surface of the semiconductor wafer W is momentarily increased, whereas the temperature of the back surface of the semiconductor wafer W is not increased so much from the preheating temperature T1. Thus, a large temperature difference arises between the front and back surfaces of the semiconductor wafer W. This causes the thermal expansion of only the front surface of the semiconductor wafer W, resulting in an abrupt deformation of the semiconductor wafer W. As a result, the semiconductor wafer W vibrates on the susceptor 74 to create particles, which in turn swirl up in the chamber 6.

To effectively discharge such particles resulting from the flash irradiation from the chamber 6, the third preferred embodiment performs the following operation. Also when ammonia is discharged after the flash heating treatment and then the nitrogen gas is supplied into the chamber 6 to return the pressure in the chamber 6 to the ordinary pressure Ps, the nitrogen gas is caused to flow at a flow rate in the range of 50 to 100 liters per minute in the chamber 6, thereby sweeping away the particles resulting from the flash irradiation. This prevents the particles resulting from the flash irradiation from being deposited on and contaminating the semiconductor wafer W.

When the nitrogen gas is supplied into the chamber 6 to return the pressure in the chamber 6 to the ordinary pressure Ps after ammonia is discharged, the valve 84 for supplying the gas may also be opened to supply the nitrogen gas into the chamber 6 while the valve 89 for exhausting the gas is left open. This enables more effective discharge of the particles resulting from the flash irradiation from the chamber 6.

In the third preferred embodiment, the pressure in the chamber 6 is reduced once to the pressure P1 lower than atmospheric pressure and then returned to the pressure P3 by supplying the gaseous mixture of ammonia and nitrogen into the chamber 6, resulting in an oxygen concentration of not greater than approximately 200 ppb in the heat treatment space 65 of the chamber 6 during the post deposition treatment of the high dielectric constant film 103, as in the first preferred embodiment. This restricts an increase in thickness of the silicon oxide film 102 underlying the high dielectric constant film 103 resulting from the oxygen taken in from the heat treatment space 65 during the post deposition annealing.

In the third preferred embodiment, the front surface of the semiconductor wafer W is irradiated with a flash of light in the irradiation time of less than one second from the flash lamps FL to raise the temperature of the front surface of the wafer in an extremely short time, as in the first preferred embodiment. Thus, the treatment time of the post deposition annealing is extremely short, and there is no time for oxygen to diffuse, thus restricting an increase in thickness of the silicon oxide film 102 underlying the high dielectric constant film 103.

In the third preferred embodiment, the post deposition annealing is performed on the high dielectric constant film 103 by irradiating the front surface of the semiconductor wafer W with a flash of light, with the pressure in the chamber 6 maintained at the pressure P3 higher than atmospheric pressure, that is, under an increased pressure. The partial pressure of ammonia is also high under the increased pressure, thus promoting nitriding even at a temperature lower than the treatment temperature T2 according to the first preferred embodiment. In other words, the treatment temperature during flash irradiation is lowered.

In the third preferred embodiment, the exhaust flow rate and the supply flow rate are changed in a stepless and continuous manner during the pressure reduction and the pressure return in the chamber 6. This prevents particles from swirling up due to abrupt changes in supplied and exhausted gas.

Fourth Preferred Embodiment

A fourth preferred embodiment of the present invention will now be described. The heat treatment apparatus 1 of the fourth preferred embodiment is exactly identical in configuration with that of the first preferred embodiment. The procedure for treatment of the semiconductor wafer W in the heat treatment apparatus 1 of the fourth preferred embodiment is substantially similar to that of the first preferred embodiment. The fourth preferred embodiment differs from the first preferred embodiment in atmosphere control during the heat treatment of a semiconductor wafer W.

While both of the preheating and flash heating treatment of a semiconductor wafer W are performed in an ammonia atmosphere in the first preferred embodiment, in the fourth preferred embodiment, a supply of ammonia is stopped during the flash heating treatment. Specifically, as in the first preferred embodiment, a semiconductor wafer W including the high dielectric constant film 103 deposited thereover is housed in the chamber 6. Subsequently, the pressure in the chamber 6 is reduced once to the pressure P1, and then, a gaseous mixture of ammonia and nitrogen gas that is a diluted gas is supplied into the heat treatment space 65 of the chamber 6 to return the pressure in the heat treatment space 65 to the ordinary pressure Ps.

After the pressure in the chamber 6 is returned to the ordinary pressure Ps, 40 halogen lamps HL of the halogen heating part 4 turn on, so that preheating of the semiconductor wafer W starts. In this preheating stage, a gaseous mixture of ammonia and nitrogen is supplied to the chamber 6, and also, the gas is exhausted from the chamber 6, thus maintaining the pressure in the chamber 6 at the ordinary pressure Ps. That is, in the preheating step, a gaseous mixture of ammonia and nitrogen is supplied into the chamber 6 to provide an ammonia atmosphere. Preheating is performed to raise the temperature of a semiconductor wafer W to the preheating temperature T1 in the ammonia atmosphere, thus nitriding the high dielectric constant film 103 to some extent.

In the fourth preferred embodiment, then, the supply of ammonia into the chamber 6 is stopped before irradiation of light from the flash lamps FL. In stopping a supply of ammonia, a supply of a nitrogen gas may be increased at a flow rate corresponding to the reduced supply flow rate of ammonia, or an exhaust flow rate of the nitrogen gas may be reduced. In any case, the pressure in the chamber 6 is maintained at the ordinary pressure Ps also after the supply of ammonia is stopped.

Stopping a supply of ammonia while continuously exhausting the gas from the chamber 6 reduces the concentration of ammonia in the chamber 6. Then, the flash lamps FL emit a flash of flight to perform a flash heating treatment at the time when the concentration of ammonia in the chamber 6 is not greater than one-tenth of the concentration obtained before a supply of ammonia is stopped. For this light emission control, a densitometer to measure the atmospheric concentration of ammonia may be placed in the chamber 6. Alternatively, a time required for the concentration of ammonia to be not greater than one-tenth of the original concentration may be determined in advance, for example, by experiment to perform flash irradiation at the time after the determined time has elapsed since a supply of ammonia was stopped.

The semiconductor wafer W is irradiated with a flash of light while a supply of ammonia to the chamber 6 is stopped, thus restricting nitriding of the high dielectric constant film 103 and also enables the hydrogen, which has entered the high dielectric constant film 103 by the reaction of ammonia and the high dielectric constant film 103 in the preheating step, to be desorbed.

The procedure after the flash heating treatment is performed as in the first preferred embodiment. Specifically, after the flash heating treatment, the pressure in the chamber 6 is reduced to the pressure P1 again, and then, a nitrogen gas is supplied into the chamber 6 to return the pressure in the chamber 6 to the ordinary pressure Ps. Also, the halogen lamps HL turn off, and the semiconductor wafer W, the temperature of which has decreased to a predetermined temperature, is transported out of the chamber 6 of the heat treatment apparatus 1.

In the fourth preferred embodiment, ammonia is supplied into the chamber 6 in the preheating step, and also, the supply of ammonia into the chamber 6 is stopped during the flash irradiation. This enables the high dielectric constant film 103 to be nitrided to some extent and also enables the hydrogen that has entered the high dielectric constant film 103 to be desorbed.

Modifications

While the preferred embodiments of the present invention have been described above, various modifications to the present invention in addition to those described above may be made without departing from the scope and spirit of the invention. For example, the pressure P1 that is the pressure to be attained during the pressure reduction in the chamber 6 is approximately 100 Pa in the preferred embodiments above, but is not limited to this value. The pressure P1 may take any appropriate value. To reduce the oxygen concentration to be attained in the chamber 6 to approximately one-tenth, it is sufficient that the pressure P1 that is the pressure to be attained during the pressure reduction in the chamber 6 is approximately one-tenth (approximately 10000 Pa) of atmospheric pressure. Making the pressure P1 lower (i.e., reducing the pressure to a higher vacuum) achieves a lower concentration of oxygen remaining in the chamber 6 after the pressure return, but requires a longer time to reduce the pressure to the pressure P1. It is therefore preferable that the pressure P1 be set in consideration of a balance between the oxygen concentration required for the execution of the post deposition annealing and the throughput.

It is preferable that the pressure P1 that is the pressure to be attained during the pressure reduction in the chamber 6 be set to be not greater than one-hundredth of the pressure in the chamber 6 during the heat treatment of the semiconductor wafer W, that is, a target pressure (the ordinary pressure Ps in the first preferred embodiment, the pressure P2 in the second preferred embodiment, the pressure P3 in the third preferred embodiment) during the return of pressure in the chamber 6. This reduces the influence of remaining air on an ammonia atmosphere during the heat treatment of the semiconductor wafer W.

While the three bypass lines 197, 198, and 199 are provided to control the exhaust flow rate from the chamber 6 in the preferred embodiments above, the number of bypass lines may be not less than two. The exhaust flow rate from the chamber 6 may be controlled by a throttle valve or a gas ballast provided in place of the plurality of bypass lines 197, 198, and 199. Alternatively, a mass flow controller may be used in place of the flow regulating valves 90 and 196.

The exhaust flow rate from the chamber 6 during the pressure reduction is changed in two levels in the first and second preferred embodiments, and the exhaust flow rate is increased in a stepless and continuous manner in the third preferred embodiment. The present invention, however, is not limited to the above, and for example, the exhaust flow rate may be changed in multiple levels. That is, it is only necessary that the exhaust flow rate during the reduction in pressure in the chamber 6 be increased with time.

Similarly, while the supply flow rate to the chamber 6 during the pressure return is increased in a stepless and continuous manner in the third preferred embodiment, it may be changed in two or more levels to increase the supply flow rate. That is, it is only necessary that the supply flow rate during the return of pressure in the chamber 6 be increased with time.

In the reduction and return of the pressure in the chamber 6, the controller 3 may control the valves and the like based on the amount of elapsed time from the start (time t1) of the pressure reduction or may feedback-control the valves and the like based on the result of the measurement of the pressure in the heat treatment space 65 by means of the pressure gauge 180. In the control based on the elapsed time, a relationship between the elapsed time and the pressure in the chamber 6 may be determined by experiment or simulation.

While the gaseous mixture of ammonia and nitrogen gas is supplied into the chamber 6 in the preferred embodiments above, the present invention is not limited to this and can use, for example, hydrogen gas ($H_2$), argon (Ar), helium (He), or xenon (Xe) as a diluted gas to be mixed with ammonia. A gaseous mixture of ammonia and any of the above-mentioned gases can be supplied into the heat treatment space 65 to provide an ammonia atmosphere in the chamber 6. In particular, helium has high capability of extracting heat and is used also as a cooling gas. The use of a gaseous mixture of ammonia and helium accordingly increases the speed of cooling a semiconductor wafer W after the flash heating treatment.

The treatment gas may be an oxygen-based reactive gas such as a nitrogen oxide, oxygen, or ozone. For example, a trace amount of ozone may be introduced for heat treatment of a high dielectric constant film. In such a case, the controllability of the concentration of an oxygen-containing gas such as ozone will decrease unless the concentration of oxygen, which is a background, remaining in the chamber 6 is reduced sufficiently. The controllability of the concentration of an oxygen-based gas can be enhanced by reducing the concentration of oxygen in the heat treatment space 65 of the chamber 6 in advance, as in the preferred embodiments above. Therefore, the technology according to the present invention becomes significant even when an oxygen-based reactive gas is used.

In the fourth preferred embodiment, the reduction in pressure in the chamber 6 may be started simultaneously with stopping a supply of ammonia. In this case, the semiconductor wafer W is preheated in an ammonia atmosphere at ordinary pressure, and a flash heating treatment is performed while reducing a pressure in the chamber 6.

In the preferred embodiments above, a heat treatment is performed on the semiconductor wafer W including the high dielectric constant film 103, serving as a gate insulating film, deposited on the silicon oxide film 102 that serves as an interfacial film (FIG. 9). Alternatively, a heat treatment may be performed on the semiconductor wafer W including a metal gate further deposited on the high dielectric constant film 103. The raw material for the metal gate may be, for example, titanium nitride (TiN), titanium aluminum (TiAl), or tungsten (W). Preheating and flash heating treatment are performed on the semiconductor wafer W including the metal gate deposited on the high dielectric constant film 103 in a procedure similar to those of the preferred embodiments. As a result, post deposition annealing can be performed to eliminate a large number of defects present in the high dielectric constant film 103 after the deposition.

In the case where a heat treatment is performed on the semiconductor wafer W including the metal gate formed thereover, the metal gate itself may be oxidized. In some cases, oxygen may diffuse through the metal gate and the high dielectric constant film 103 to increase the thickness of the silicon oxide film 102. As in the preferred embodiments above, by reducing the pressure in the chamber 6 once to the pressure P1 and then returning the pressure, the concentration of oxygen in the chamber 6 is set to be extremely low, and then, preheating and flash heating treatment are performed on the semiconductor wafer W. This restricts an increase in thickness of the silicon oxide film 102 and also prevents oxidation of the metal gate itself.

The material for the base material 101 is not limited to silicon and may be germanium (Ge) or silicon germanium. When the material for the base material 101 is not silicon, the material for the interfacial film underlying the high dielectric constant film 103 may not be silicon dioxide.

While the invention has been described in detail, the foregoing description is in all aspects illustrative and not restrictive. It is understood that numerous other modifications and variations can be devised without departing from the scope of the invention.

What is claimed is:

1. A method of irradiating a substrate including a high dielectric constant film deposited thereover with a flash of light to heat said substrate, the method comprising:
   (a) transporting a substrate including a high dielectric constant film deposited thereover into a chamber;
   (b) reducing a pressure in said chamber to a first pressure lower than atmospheric pressure;
   (c) returning the pressure in said chamber from the first pressure to a second pressure higher than the first pressure; and
   (d) irradiating a front surface of said substrate with a flash of light from a flash lamp while maintaining the pressure in said chamber at the second pressure, wherein a reactive gas including ammonia is introduced into said chamber in said step (c).

2. The method according to claim 1,
   wherein the first pressure is not greater than one-hundredth of the second pressure.

3. The method according to claim 1, further comprising
   (e) before said step (d), raising a temperature of said substrate to a predetermined preheating temperature,
   wherein a supply of the reactive gas into said chamber is performed in said step (e), and the supply of the reactive gas into said chamber is stopped after said step (d).

4. The method according to claim 3,
   wherein the supply of the reactive gas is stopped, and simultaneously, the reducing the pressure in said chamber is started.

5. The method according to claim 1,
   wherein the second pressure is higher than the first pressure and lower than atmospheric pressure.

6. The method according to claim 1,
   wherein the second pressure comprises atmospheric pressure.

7. The method according to claim 1,
   wherein the second pressure is higher than atmospheric pressure.

8. The method according to claim 1,
   wherein an exhaust flow rate from said chamber is increased with time in said step (b).

9. The method according to claim 1,
   wherein a supply flow rate into said chamber is increased with time in said step (c).

10. The method according to claim 1,
    wherein after said step (d), when a gas in said chamber is discharged and then an inert gas is supplied into said chamber so that the pressure in said chamber returns to atmospheric pressure, the inert gas is caused to flow at a flow rate ranging from 50 to 100 liters per minute in said chamber.

* * * * *